(12) United States Patent
Herner et al.

(10) Patent No.: US 9,178,106 B2
(45) Date of Patent: Nov. 3, 2015

(54) NANOWIRE SIZED OPTO-ELECTRONIC STRUCTURE AND METHOD FOR MODIFYING SELECTED PORTIONS OF SAME

(71) Applicant: Glo AB, Lund (SE)

(72) Inventors: Scott Brad Herner, San Jose, CA (US); Daniel Bryce Thompson, Walnut Creek, CA (US); Cynthia Lemay, Santa Clara, CA (US)

(73) Assignee: GLO AB, Lund (SE)

( * ) Notice: Subject to any disclaimer, the term of this patent is extended or adjusted under 35 U.S.C. 154(b) by 71 days.

(21) Appl. No.: 14/059,658

(22) Filed: Oct. 22, 2013

(65) Prior Publication Data

US 2014/0117307 A1    May 1, 2014

Related U.S. Application Data

(60) Provisional application No. 61/718,884, filed on Oct. 26, 2012.

(51) Int. Cl.
| | |
|---|---|
| H01L 21/00 | (2006.01) |
| H01L 33/00 | (2010.01) |
| H01L 33/04 | (2010.01) |
| H01L 33/44 | (2010.01) |
| H01L 33/24 | (2010.01) |

(52) U.S. Cl.
CPC ........ *H01L 33/0075* (2013.01); *H01L 33/0095* (2013.01); *H01L 33/04* (2013.01); *H01L 33/44* (2013.01); *H01L 33/24* (2013.01); *H01L 2933/0016* (2013.01)

(58) Field of Classification Search
CPC ..................................................... H01L 33/075

USPC ................................ 438/478, 22; 257/E21.09
See application file for complete search history.

(56) References Cited

U.S. PATENT DOCUMENTS

| 7,335,908 B2 | 2/2008 | Samuelson et al. |
| 7,396,696 B2 | 7/2008 | Kim et al. |

(Continued)

FOREIGN PATENT DOCUMENTS

| JP | 2009147140 | 7/2009 |
| KR | 10-2009-0111810 A | 10/2009 |

(Continued)

OTHER PUBLICATIONS

International Search Report and Written Opinion received in connection with international application No. PCT/US2013/066129; mailed Mar. 20, 2014.

(Continued)

*Primary Examiner* — Matthew Landau
*Assistant Examiner* — Igwe U Anya
(74) *Attorney, Agent, or Firm* — The Marbury Law Group PLLC

(57) ABSTRACT

A method for treating a LED structure with a substance, the LED structure includes an array of nanowires on a planar support. The method includes producing the substance at a source and causing it to move to the array along a line. The angle between the line followed by the substance and the plane of the support is less than 90° when measured from the center of the support. The substance is capable of rendering a portion of the nanowires nonconductive or less conductive compared to before being treated by the substance.

11 Claims, 18 Drawing Sheets

(56) References Cited

U.S. PATENT DOCUMENTS

| | | | |
|---|---|---|---|
| 7,829,443 B2 | 11/2010 | Seifert et al. | |
| 8,350,249 B1 | 1/2013 | Svensson | |
| 2007/0202673 A1* | 8/2007 | Kim et al. | 438/580 |
| 2008/0036038 A1* | 2/2008 | Hersee et al. | 257/615 |
| 2008/0246961 A1* | 10/2008 | Zhang et al. | 356/317 |
| 2010/0102380 A1* | 4/2010 | Ohlsson et al. | 257/329 |
| 2010/0283064 A1* | 11/2010 | Samuelson et al. | 257/88 |
| 2011/0079766 A1 | 4/2011 | Wildeson et al. | |
| 2011/0089477 A1* | 4/2011 | Wernersson | 257/312 |
| 2011/0163292 A1 | 7/2011 | Wang et al. | |
| 2011/0254034 A1 | 10/2011 | Konsek et al. | |
| 2011/0309382 A1* | 12/2011 | Lowgren | 257/88 |
| 2012/0061660 A1 | 3/2012 | Lu et al. | |
| 2012/0211727 A1 | 8/2012 | Ohlsson et al. | |
| 2013/0221322 A1 | 8/2013 | Ohlsson | |

FOREIGN PATENT DOCUMENTS

| | | |
|---|---|---|
| KR | 1020100080094 A | 7/2010 |
| KR | 1020110105641 A | 9/2011 |
| KR | 10-2012-0028104 A | 3/2012 |
| KR | 1020120092091 A | 8/2012 |
| WO | WO 2007/102781 A1 | 9/2007 |
| WO | WO2008/048704 A2 | 4/2008 |
| WO | WO 2010/014032 A1 | 2/2010 |
| WO | WO 2011/160051 | 12/2011 |
| WO | WO 2011/162715 | 12/2011 |
| WO | WO2012/050888 A2 | 4/2012 |
| WO | WO 2013/025874 | 2/2013 |

OTHER PUBLICATIONS

U.S. Appl. No. 61/719,133 entitled "Nanowire Sized Opto-electronic Structure and Method for Modifying Selected Portions of Same,", filed Oct. 26, 2012.

U.S. Appl. No. 14/059,950 entitled "Nanowire Sized Opto-electronic Structure and Method for Modifying Selected Portions of Same,", filed Oct. 22, 2013.

U.S. Appl. No. 61/719,108 entitled "Nanowire LED Structure and Method for Manufacturing the Same,", filed Oct. 26, 2012.

U.S. Appl. No. 14/059,629, entitled "Nanowire LED Structure and Method for Manufacturing the Same,", filed Oct. 22, 2013.

International Search Report and Written Opinion received in connection with international application No. PCT/US2013/066165; mailed Feb. 14, 2014.

International Search Report and Written Opinion received in connection with international application No. PCT/US2013/066151; mailed Feb. 17, 2014.

Binari et al., "H, He, and N implant isolation of n-type GaN", J. Appl. Phys. 78, 3008 (1995).

Pearton et al., "Thermal stability of $^2$H-implanted $n$- and $p$-type GaN", Appl. Phys. Lett., 73, 1877 (1998).

Pearton et. al., "Reactivation of acceptors and trapping of hydrogen in GaN/InGaN double heterostructures", Appl. Phys. Lett., 69, 1879 (1996).

International Search Report and Written Opinion received in connection with international application No. PCT/US2014/069429, issued Apr. 23, 2015.

* cited by examiner

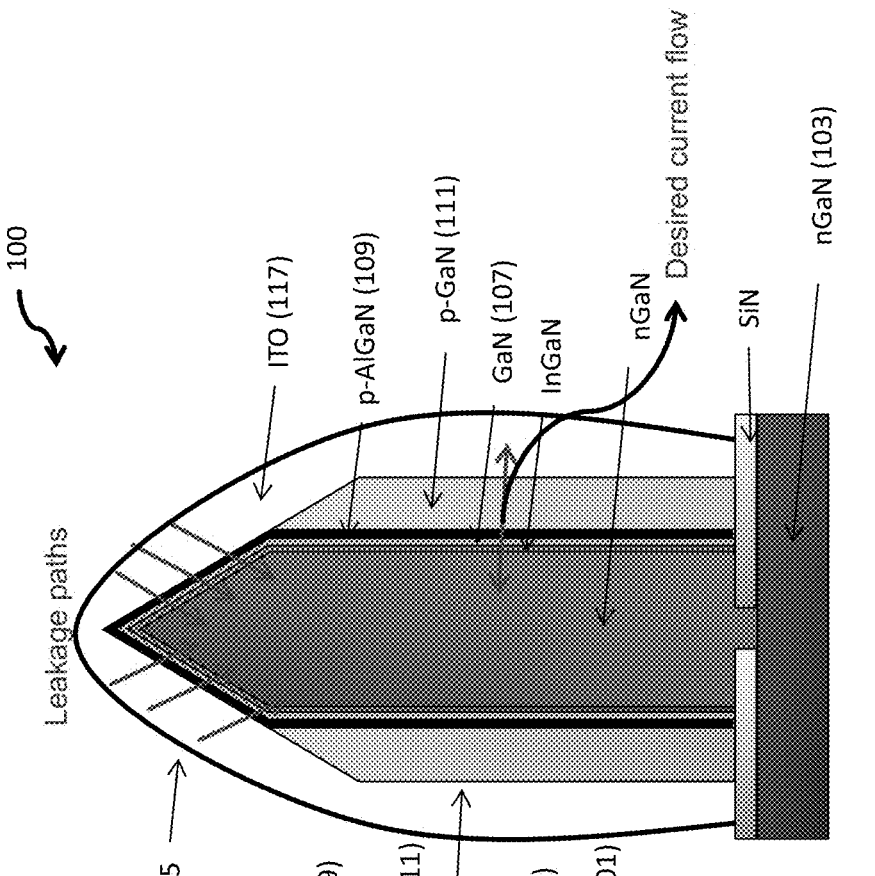
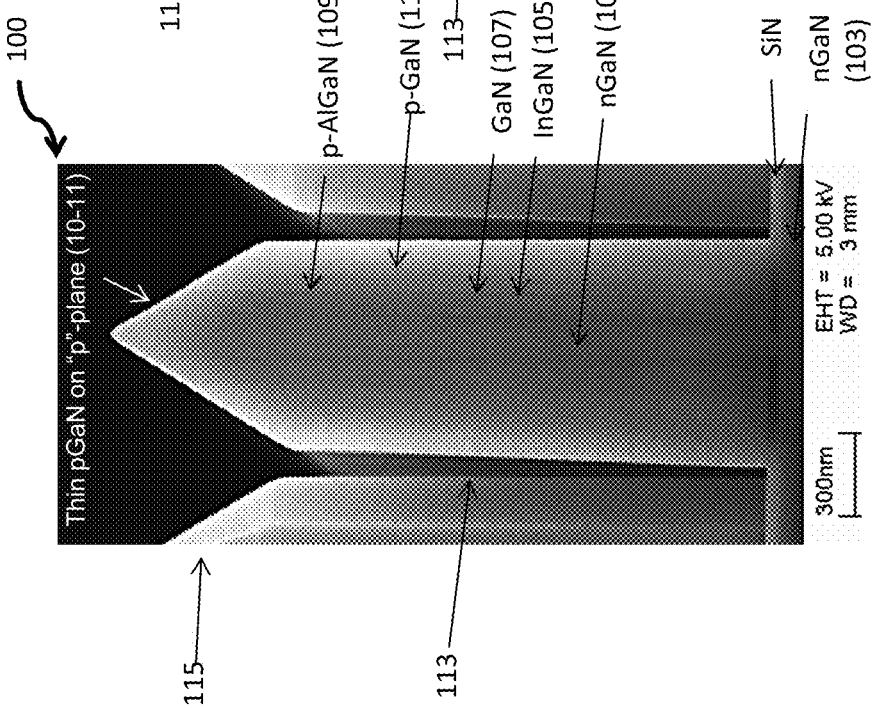

Electroluminescence spectra showing two peaks (201, 203) with shorter wavelength from m-plane (10-10) and longer wavelength from "p"-plane (10-11)

Cross section SEM image shows quantum wells on both m-plane (10-10) and "p"-plane (10-11)

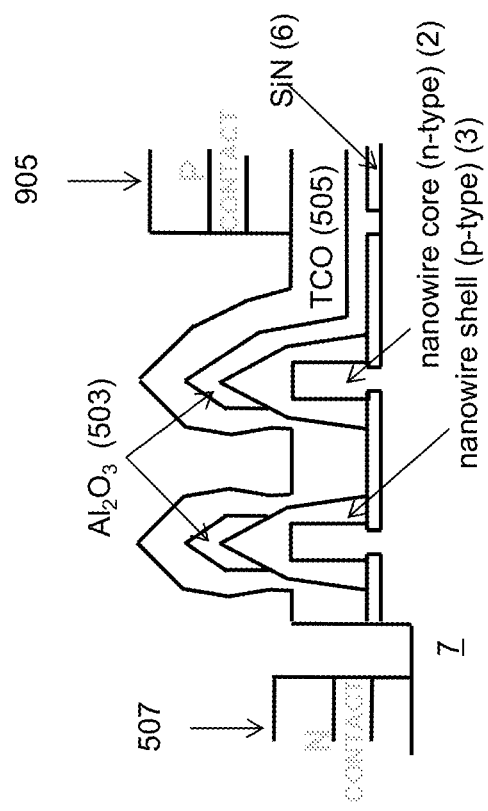

*Figure 7B*
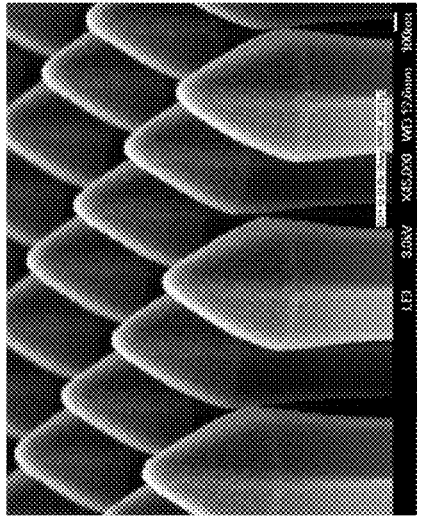
Amorphous Al$_2$O$_3$ film is slightly rough, visible on tips
NO Al$_2$O$_3$ deposition visible on lower half of wire
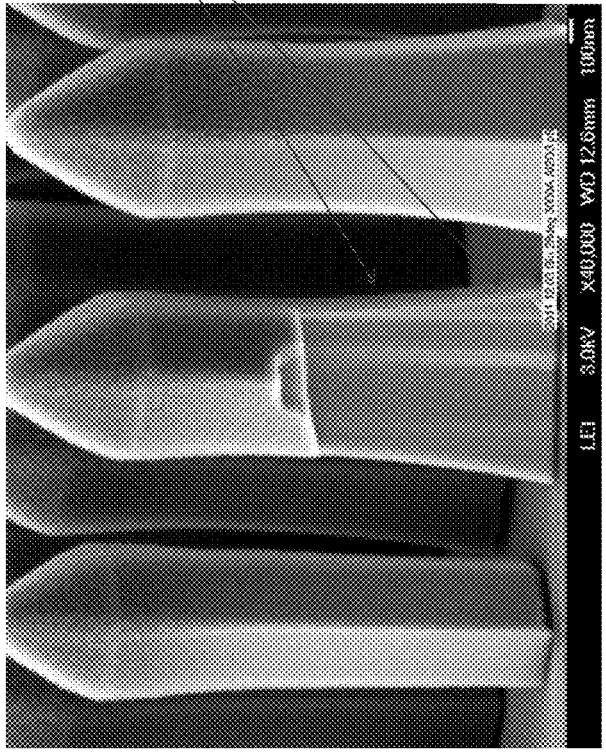

Process Flow with Dry Etch

Process Flow with Laser Ablation

NANOWIRE SIZED OPTO-ELECTRONIC STRUCTURE AND METHOD FOR MODIFYING SELECTED PORTIONS OF SAME

RELATED APPLICATION

This application claims the benefit of priority to U.S. Provisional Application Ser. No. 61/718,884, filed Oct. 26, 2012, the entire contents of which are incorporated herein by reference.

FIELD

The present invention is directed to nanostructured devices in general and to nanowire LEDs in particular.

BACKGROUND OF THE INVENTION

Nanowire light emitting diodes (LED) are of increasing interest as an alternative to planar LEDs. In comparison with LEDs produced with conventional planar technology, nanowire LEDs offer unique properties due to the three-dimensional nature of the nanowires, improved flexibility in materials combinations due to less lattice matching restrictions and opportunities for processing on larger substrates.

Despite the advantages of nanowire LEDs, contacting of the nanowire LEDs requires new routes as compared to planar technology. Since nanowire LEDs comprise large arrays of nanowires, thereby forming a three-dimensional surface with high aspect ratio structures, deposition of contact material using line-of-sight processes is a challenging operation, and alternative methods of forming contacts would be useful.

SUMMARY OF THE INVENTION

In one aspect, the invention provides methods. In certain embodiments, the invention provides a method for treating a LED structure with a substance that comprises an array of nanowires on a planar support comprising producing the substance at a source and causing it to move to the array along a line, wherein (i) the angle between the line followed by the substance and the plane of the support is less than 90° when measured from the center of the support; and (ii) the substance is capable of rendering a portion of the nanowires nonconductive or less conductive compared to before being treated by the substance. In certain embodiments, the substance is an insulator and renders the portion of the nanowires nonconductive or less conductive by coating the portion, e.g., wherein the substance comprises $Al_2O_3$.

In certain embodiments, the substance reacts with the portion of the nanowire to render the portion nonconductive or less conductive. In certain embodiments, the substance comprises $^2H^+$. In certain embodiments, the angle is less than 45°, such as less than 30°. In certain embodiments, the substance is produced and caused to move to the nanowires by physical vapor deposition (PVD). In certain embodiments, the PVD comprises evaporation. In certain embodiments, the PVD comprises sputter deposition. In certain embodiments, the nanowires comprise a tip and a sidewall, and the array comprises edge nanowires and central nanowires, and wherein the angle is such that central nanowires are rendered nonconductive at the tip and along a portion but not all of their sidewall. In certain embodiments, the method comprises deposition of $Al_2O_3$ or equivalent electrically insulating material, both organic and inorganic, and wherein the depth of the $Al_2O_3$ on the tip of the nanowires is between 50 and 200 nm. In certain embodiments, the nanowires comprise a first conductivity type nanowire core and a second conductivity type nanowire shell. In certain embodiments, the first conductivity type semiconductor nanowire core is enclosed by the second conductivity type semiconductor shell for forming a pn or pin junction that in operation provides an active region for light generation. In certain embodiments, the first conductivity type comprises n-type, the second conductivity type comprises p-type. In certain embodiments, the support comprises a n-type buffer layer from which the nanowire core is grown during production of the array of nanowires. In certain embodiments, the buffer layer comprises at least one of gallium nitride or aluminum gallium nitride. In certain embodiments, the support further comprises a dielectric masking layer, such that cores protrude from the buffer layer through openings in the masking layer, and the shells are located on the masking layer. In certain embodiments, the support further comprises a substrate layer beneath the buffer layer, such as a substrate layer comprising $Al_2O_3$. In certain embodiments, the support layer further comprises a reflective layer, such as a layer comprising Ag.

In certain embodiments, the method further comprises exposing the buffer layer in a first region of the LED structure, for example by laser ablation. In certain embodiments, the method further comprises forming a n-electrode in contact with the exposed buffer layer and a p-electrode in contact with the sidewalls of the nanowires that were not exposed to the substance.

In one aspect, the invention provides structures.

In certain embodiments, the invention provides a LED structure comprising a support comprising a n-GaN buffer layer and an non-conducting substrate layer and an array of nanowires on the support, wherein the nanowires comprise a n-GaN core enclosed by a p-GaN shell, where in the structure comprises (i) a n-electrode region comprising a metal contact in electrical contact with the n-GaN buffer layer; and (ii) a p-electrode region comprising (a) a non-conductive layer that comprises the tips of the nanowires and a first portion of the sidewalls of a first group of the nanowires, but not a second portion of the sidewalls of the first group of nanowires; (b) a conductive layer in electrical contact with the second portion of the sidewalls of the first group of nanowires; and (c) a metal contact in electrical contact with the conductive layer.

In certain embodiments, the non-conductive layer comprises all of the sidewalls of a second group of the nanowires, wherein the first group of nanowires are in the interior of the nanowire array and the second group of nanowires are on the exterior edge of the nanowire array. In certain embodiments, the non-conductive layer comprises an insulating material layer on top of the tips and the portions of the sidewalls. In certain embodiments, the non-conductive layer comprises $Al_2O_3$ or equivalent electrically insulating material, both organic and inorganic. In certain embodiments, the non-conductive layer comprises a modified portion of the p-GaN shell that has been modified to reduce or eliminate its conductivity. In certain embodiments, the first portion of the sidewalls of the first group of nanowires extends less than 400 nm down the sidewall of the nanowires from the tip. In certain embodiments, the metal contacts comprise a layer of Al, a layer of Ti, and a layer of Au. In some of these embodiments, the Al layer is in direct contact with the n-GaN buffer layer in the n-electrode and the conductive layer in the p-electrode. Certain suitable metal contacts include TiAu, TiAlTiAu, and CrPdAu.

BRIEF DESCRIPTION OF THE DRAWINGS

FIGS. 1A and B schematically illustrates an exemplary nanowire LED with current leakage.

FIGS. 5A-C illustrate one embodiment of the methods of the invention.

DETAILED DESCRIPTION OF THE INVENTION

The invention provides methods for altering the properties of selected areas of nanowire based structures, in particular opto-electronic structures such as LEDs, for example, nanowire light emitting diodes (LEDs), e.g., altering the properties to decrease conductivity of selected portions of nanowires in a nanowire LED. The invention also provides compositions that can be fabricated, e.g., using the methods of the invention.

Figure 2:
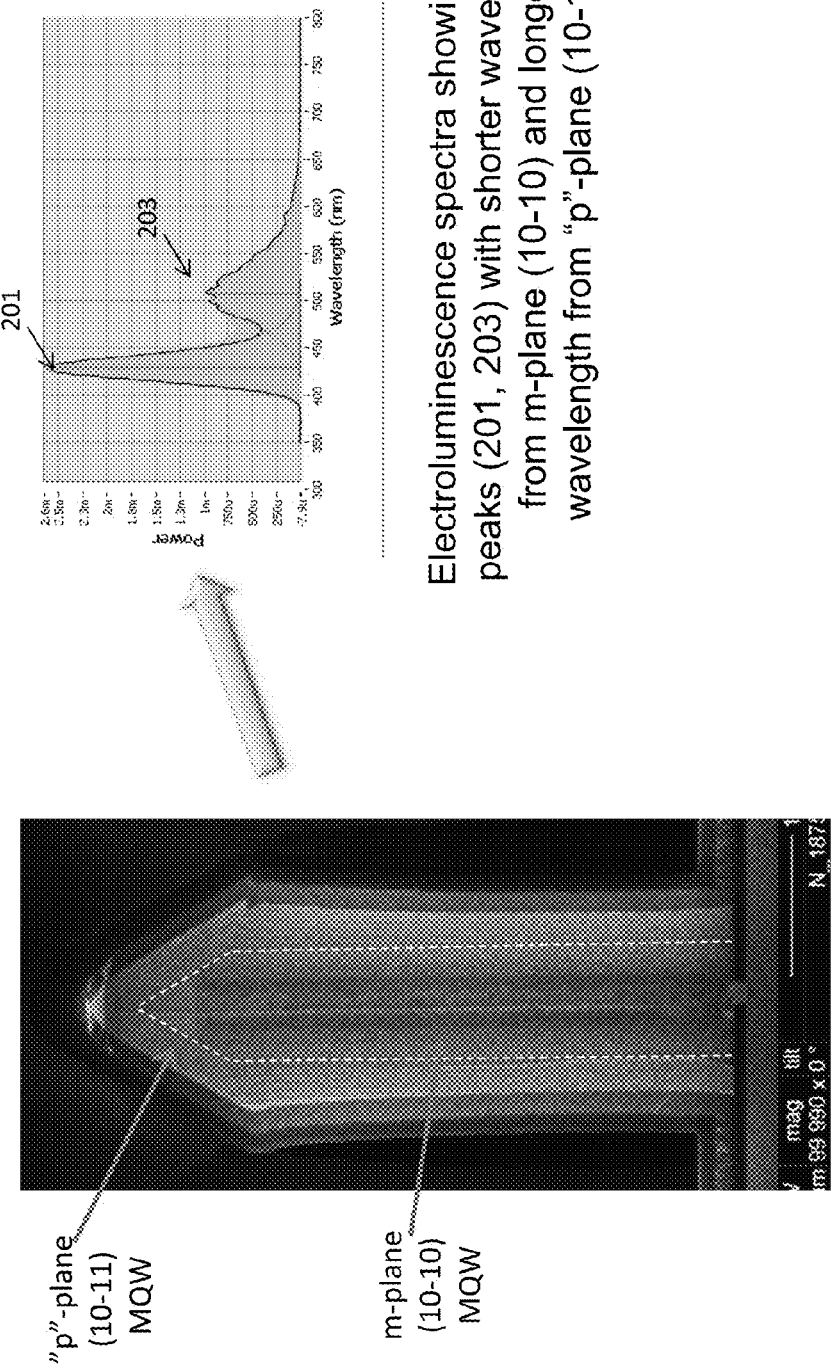
FIG. 2 schematically illustrates an exemplary nanowire LED with multiple emission wavelengths.

The 3-dimensional nature of LEDs made from nanowires emerging from a planar surface can present challenges in device architecture. Different crystallographic planes can give different growth rates, material composition, and doping. This can, for example, cause leakage paths and multiple emission wavelengths not desirable for the device. An example is a nanowire LED as illustrated in FIGS. 1A and 1B. In this example, a nanowire LED 100 includes a n-GaN core 101 in electrical contact with an n-GaN buffer layer 103, intermediate layers of In—GaN 105, GaN 107, and p-AlGaN 109, overlaid with an outer layer of p-GaN 111, with a vertical sidewall 113 and a conical tip 115. There are two growth planes, the m-plane on the sidewall 113 and the p-plane on the conical tip 115; the p-GaN 111 has a very low growth rate on the p-plane, FIG. 1A. If a contact 117 covers the full nanowire 100, there can be a leak (short circuit) through the thin p-GaN layer 111 on the surface of the p plane, FIG. 1B. In addition, as shown in FIG. 2, the unequal distribution of p-GaN can result in multiple emission wavelengths from the LED, as illustrated by the electroluminescence spectra showing two peaks 201, 203 with a shorter wavelength from the m-plane (10-10) and a longer wavelength from the p-plane (10-11).

In order to maximize light production, it is desirable to selectively alter properties of certain parts of the nanowires in an LED in order to reduce or eliminate short-circuiting and multiple wavelength emission. The present invention provides methods and structures to alter properties of selected parts of nanowires, in particular methods and structures where the conductivity of tips and corners of nanowires in a nanowire LED is selectively reduced but the conductivity of a portion of the sidewalls is unchanged or substantially unchanged. In some embodiments of the invention, a layer of insulating material is selectively deposited over the tips of the nanowires but not over some portion of the sidewalls. In other embodiments of the invention, the surface of the tips of the nanowires are selectively altered to reduce their conductivity but some portion of the sidewalls remains unaltered or substantially unaltered in their conductivity. In methods of the invention, a material is produced at a source that is located such that the material travels at an angle from the source to the LED, where it interacts with selected surfaces of the nanowires in the LED to alter the properties of the surface, e.g., to coat the surface or to alter part of the surface. The portion of the nanowire that is isolated from the sidewall can be controlled by the angle between the source of the material and the LED, so that the portion of the sidewall that remains unaltered or substantially unaltered can be controlled. In certain embodiments, laser ablation of selected portions of a nanowire LED structure is combined with the angled travel of the material to produce desired properties in the LED structure. Laser ablation is described more fully in U.S. Provisional Patent application entitled Nanowire LED structure and method for manufacturing the same, filed on even date herewith, and hereby incorporated by reference herein in its entirety.

In some embodiments, an insulating material is deposited on a LED array of nanowires by known techniques, e.g., electron beam physical vapor deposition, where the source of the insulating material is at an angle from the LED array, where the angle can be selected based on the desired degree of deposition on tips versus sidewalls of the nanowires in the nanowire LED array. The LED array is rotated during deposition. Due to the low angle of the insulating material and the nature of the nanowire shape, only the tips of all nanowires, the outer ring of nanowires in a group, and open fields (no nanowires) are coated. The sidewalls (length) of the nanowire among interior nanowires are "shadowed" during the angled deposition. The insulator acts as a non-conductive or very low conductivity layer on the tips and, depending on the angle of deposition, part of the sidewalls of the nanowires, but not all of the sidewalls of the nanowires. The portion of the sidewalls of interior nanowires that remains free of the insulator is determined by the angle between the source of the insulator and the LED array of nanowires during deposition.

In some embodiments, a material capable of altering the properties of the surface of the LED, e.g., $H_2^+$ for decreasing conductivity, is directed at a LED array of nanowires by known techniques, as described herein, where the source of the material is at an angle from the LED array, where the angle can be selected based on the desired portion of the nanowires that one desires to be isolated in the nanowire LED array. The LED array is rotated during directional transmission of the material from its source to the array. Due to the low angle of the material and the nature of the nanowire shape, only the surfaces of tips of all nanowires, the surfaces of outer ring of nanowires in a group, and the surfaces of open fields (nanowires with no nearest neighbors on one or more sides) are altered. The sidewalls (length) of the nanowire among interior nanowires is "shadowed" during the angled direction of the material. The material alters the properties of the selected surfaces of the nanowire LED structure, e.g., $H_2^+$ interacts with the surface of the p-GaN layer to render it less conductive. The portion of the sidewalls of interior nanowires that remains free of alteration is determined by the angle between the source of the material and the LED array of nanowires during direction of the material to the LED array.

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. Generally, nanowires with a polygonal cross section are considered to have at least two dimensions each of which are not greater than 300 nm. However, the nanowires can have a diameter or width of up to about 1 micron. The one dimensional nature of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature is often associated with an elongated shape. In other words, "one dimensional" refers to a width or diameter less than 1 micron and a length greater than 1 micron. Since nanowires may have various cross-sectional shapes, the diameter is intended to refer to the effective diameter. By effective diameter, it is meant the average of the major and minor axis of the cross-section of the structure. Although in the figures the nano elements are shown to be pillar-like and based on nanowire cores, i.e., more or less "one dimensional" cores, it should be noted that the cores can also have other geometries such as pyramids with various polygonal bases, such as square, hexagonal, octagonal, etc. Thus, as used herein, the core may comprise any suitable nano element having a width or diameter of less than 1 micron and a length greater than 1 micron and may comprise a single structure or a multi-component structure. For example, the core may comprise a semiconductor nanowire of one conductivity type or it may comprise the semiconductor nanowire of one conductivity type surrounded by one or more semiconductor shells of the same conductivity type and the core having a pillar or pyramid shape. For simplicity, a single component nanowire pillar core will be described below and illustrated in the figures.

All references to upper, top, lower, downwards, etc., are made as considering the substrate being at the bottom and the nanowires extending upwards from the substrate. Vertical refers to a direction parallel to the longer extension of the nanowire, and horizontal to a direction parallel to the plane formed by the substrate. This nomenclature is introduced for the ease of understanding only, and should not be considered as limiting to specific assembly orientation etc.

In the methods of the invention, angled direction of a material to a nanowire LED array is used in one or more steps of the methods to selectively alter the properties of certain parts of certain nanowires in the structure while leaving other parts unaltered, e.g., altering the properties of the tips of the nanowires to render them less conductive while leaving the conductivity of part or all of the sidewalls of the nanowires unchanged or substantially unchanged. The material directed to the nanowire array may be, e.g., an insulator, or, e.g., a material that alters the characteristics of selected surfaces of the nanowire, as described more fully herein. The alteration in the conductivity, e.g., decrease in conductivity, of the tips but not the sidewalls provides for less leakage in the tips and more optimal light production from the nanowire LED display. In certain embodiments, laser ablation of selected portions of the nanowire display may also be used to produce desired results, as described more fully herein.

Any suitable nanowire LED structure as known in the art may be used in the methods of the invention.

Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

Figure 3:
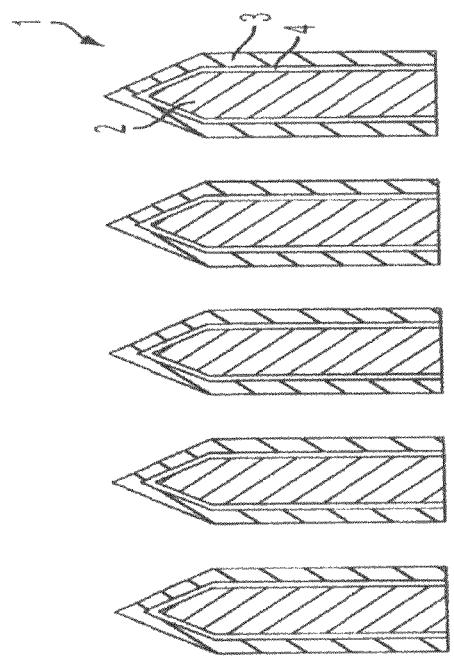
FIG. 3 schematically illustrates a side cross sectional view of a basis of a nanowire LED in accordance with embodiments of the invention.

FIG. 3 schematically illustrates the basis for a nanowire LED structure that is modified in accordance with some embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being made up from nanowires 1 having an n-type nanowire core 2 and a p-type shell 3 at least partly enclosing the nanowire core 2 and an intermediate active layer 4. However, for the purpose of embodiments of the invention nanowire LEDs are not limited to this. For example the nanowire core 2, the active layer 4 and the p-type shell 3 may be made up from a multitude of layers or segments. By controlling growth conditions the final geometry of a LED can range from elongated, narrow "pillar structures" to relatively wide based pyramid structures.

In alternative embodiments, only the core 2 may comprise a nanostructure or nanowire by having a width or diameter below 1 micron, while the shell 3 may have a width or diameter above one micron.

For nanowire fabrication, the III-V semiconductors are of particular interest due to their properties facilitating high speed and low power electronics. The nanowires can comprise any semiconductor material, and suitable materials for the nanowire include but are not limited to: GaAs (p), InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$. A person skilled in the art is familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductors (e.g., InP, GaAs). In order to function as a LED, the n-side and p-side of each nanowire 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified in figures by the "pyramid" facets and the vertical sidewall facets. The LEDs can be fabricated so that the emission layer formed on templates with dominant pyramid facets or sidewall facets. The same is true for the contact layer, independent of the shape of the emission layer.

The use of sequential (e.g., shell) layers may result in the final individual device (e.g., a pn or pin device) having a shape anywhere between a pyramid shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 1 micron, and heights ranging from a few 100 nm to several (e.g., 10) μm.

Figure 4:
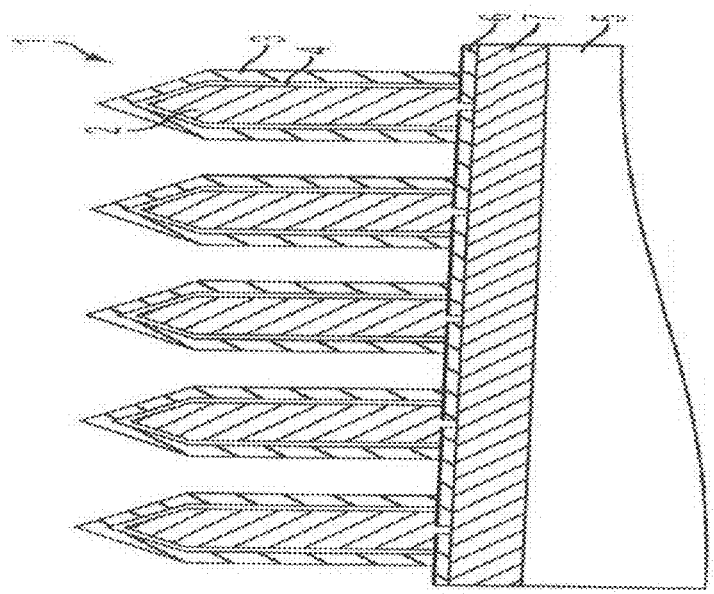
FIG. 4 schematically illustrates a side cross sectional view of a nanowire LED structure on a buffer layer in accordance with embodiments of the invention.

FIG. 4 illustrates an exemplary structure that provides a support for the nanowires. By growing the nanowires 1 on a growth substrate 5, optionally using a growth mask, or dielectric masking layer 6 (e.g., a nitride layer, such as silicon nitride dielectric masking layer) to define the position and determine the bottom interface area of the nanowires 1, the substrate 5 functions as a carrier for the nanowires 1 that protrude from the substrate 5, at least during processing. The bottom interface area of the nanowires comprises the area of the core 2 inside each opening in the dielectric masking layer 6. The substrate 5 may comprise different materials such as III-V or II-VI semiconductors, Si, Ge, $Al_2O_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowires 1 are grown directly on the growth substrate 5.

In embodiments in which a dielectric masking (growth mask) layer is used, the growth mask 6 may be patterned by photolithography to define openings for the nanowire growth, as described for example in U.S. Pat. No. 7,829,443, incorporated herein by reference in its entirety. In this implementation, the nanowires are grouped in an n-pad area, a non-active area, a LED area (i.e., the area which emits light) and a p-pad area. However, embodiments of the invention are not limited to this. For example the p-pad area may be arranged on top of the nanowires forming the light emitting part of the nanowire LED structure, whereby the p-pad area and the LED area coincide, as described in PCT International Application Publication Number WO 2010/014032 A1 to Konsek, et al., published Feb. 4, 2010 and incorporated herein by reference in its entirety.

Preferably, the substrate 5 is also adapted to function as a current transport layer connecting to the n-side of each nanowire 1. This can be accomplished by having a substrate 5 that comprises a buffer layer 7 arranged on the surface of the substrate 5 facing the nanowires 1, as shown in FIG. 4, by way of example a III-nitride layer, such as a GaN and/or AlGaN buffer layer 7 on a Si substrate 5. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The nanowires can comprise any semiconductor material, but for nanowire LEDs III-V semiconductors such as a III-nitride semiconductor (e.g., GaN, AlInGaN, AlGaN and InGaN, etc.) or other semiconductors (e.g., InP, GaAs) are usually preferred. The growth of nanowires can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein.

It should be noted that the nanowire 1 may comprise several different materials (e.g., GaN core, InGaN active layer and InGaN shell having a different In to Ga ratio than the active layer). In general the substrate 5 and/or the buffer layer 7 are referred to herein as a support or a support layer for the nanowires. In certain embodiments, a conductive layer (e.g., a mirror or transparent contact) may be used as a support instead of or in addition to the substrate 5 and/or the buffer layer 7. Thus, the term "support layer" or "support" may include any one or more of these elements.

The use of sequential (e.g., shell) layers gives that the final individual device (e.g., a pn or pin device) may have a shape anywhere between a pyramid or tapered shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 1 micron, and heights ranging from a few 100 nm to several (e.g., 10) μm. The buffer layer 7 provides a structure for contacting the n-side of the nanowires 1. The above description of an exemplary embodiment of a LED structure will serve as a basis for the description of the methods and compositions of the invention; however, it will be appreciated that any suitable nanowire LED structure or other suitable nanowire structure may also be used in the methods and compositions, with any necessary modifications as will be apparent to one of skill in the art, without departing from the invention.

In certain embodiments, the invention provides methods of treating a nanowire LED structure to selectively alter the characteristics of parts of the structure.

In certain embodiments, the invention provides a method for treating a LED structure that comprises an array of nanowires on a planar support comprising producing the substance at a source and causing it to move to the array along a line, wherein (i) the angle between the line followed by the substance and the plane of the support is less than 90° when measured from the center of the support; and (ii) the substance is capable of rendering a portion of the nanowires nonconductive or less conductive compared to before being treated by the substance. The LED structure is typically rotated about an axis, or several axes, to expose different portions of the structure to the substance produced at the source; in these cases, the center of the support is considered to be the intersection of the axis of rotation with the support.

In certain of these embodiments, the substance is an insulator, and renders the portion of the nanowires nonconductive or less conductive by coating the portion. Suitable dielectric materials for use as insulators include $Al_2O_3$, iZnO, $SiO_2$, $TiO_2$, SiN, and $HfO_2$. In certain embodiments, the substance is $Al_2O_3$.

In certain of these embodiments, the substance reacts with the portion of the nanowire to render the portion nonconductive or less conductive; for example, in certain embodiments the substance comprises $H_2^+$.

The angle may be any suitable angle to achieve rendering a desired portion of the LED structure less conductive. In certain embodiments the angle is chosen so as to leave parts of the nanowires unexposed to the substance so that they are not altered by the substance. The angle may be, e.g., less than 80, 70, 60, 50, 45, 40, 30, 25, 20, 15, 10, or 5 degrees. In certain embodiments, the angle is less than 45 degrees. In certain embodiments, the angle is less than 30 degrees. In certain embodiments, the angle is less than 25 degrees. In certain embodiments, the angle is less than 20 degrees, such as 15 degrees. In certain embodiments, the angle is between 1 and 85 degrees, such as between 2 and 60 degrees, e.g., between 5 and 50 degrees, such as between 5 and 35 degrees.

In certain embodiments, the substance, such as an insulating substance, is produced from the source and caused to move to the nanowires of the LED structure by physical vapor deposition (PVD), such as by electron beam evaporation, or such as by sputter deposition, or atomic layer deposition (ALD).

The nanowires may comprise a tip and a sidewall, and the array may comprise edge nanowires and central nanowires; in such embodiments, the angle in certain embodiments is such that central nanowires are rendered nonconductive at the tip and along a portion but not all of their sidewall. For example, the method may comprise deposition of $Al_2O_3$ and wherein the thickness of the $Al_2O_3$ on the tip of the nanowires is between 50 and 200 nm. In certain embodiments, the nanowires comprise a first conductivity type nanowire core and a second conductivity type nanowire shell, e.g., the first conductivity type semiconductor nanowire core is enclosed by the second conductivity type semiconductor shell for forming a pn or pin junction that in operation provides an active region for light generation. The first conductivity type may comprise n-type and the second conductivity type may comprise p-type. In certain embodiments, the support comprises a n-type buffer layer from which the nanowire core is grown during production of the array of nanowires, such as at least one of gallium nitride or aluminum gallium nitride. In certain embodiments, the support further comprises a dielectric masking layer, such that cores protrude from the buffer layer through openings in the masking layer, and the shells are located on the masking layer. The support may further comprise a substrate layer beneath the buffer layer, such as a substrate layer comprising $Al_2O_3$. In certain embodiments, the support layer further comprises a reflective layer, such as a layer comprising Ag.

In certain embodiments, the method further comprise exposing the buffer layer in a first region of the LED structure, e.g., by removing over layers by laser ablation. An n-electrode may be formed in contact with the exposed buffer layer and a p-electrode in contact with the sidewalls of the nanowires that were not exposed to the substance. This may be done as described herein, e.g., by exposing the buffer layer by laser ablation then laying a contact that includes, e.g., Al, Ti, and Au or any other suitable metal or transparent conductive oxide on the buffer layer to form a n-electrode; to the p-electrode a similar metal layer may be laid over a conductive layer that is in contact with the p-GaN shells on the sidewalls of the nanowires.

The angled deposition of an insulating material may be accomplished by any suitable technique. In certain embodiments, deposition is by electron beam evaporation. $H_2^+$ implant may also be accomplished by methods known in the art, such as ion implantation, see e.g., Appl. Phys. Lett., 73, 1877 (1998); Appl. Phys. Lett. 69 (1879 (1996); and J. Appl. Phys. 78, 3008 (1995), all of which are incorporated by reference herein in their entirety. Ion implantation is a process in which energetic, charged atoms or molecules are directly introduced into a substrate. Implantation results in the atoms or molecules coming to rest below the surface of the substrate.

Figure 5A:
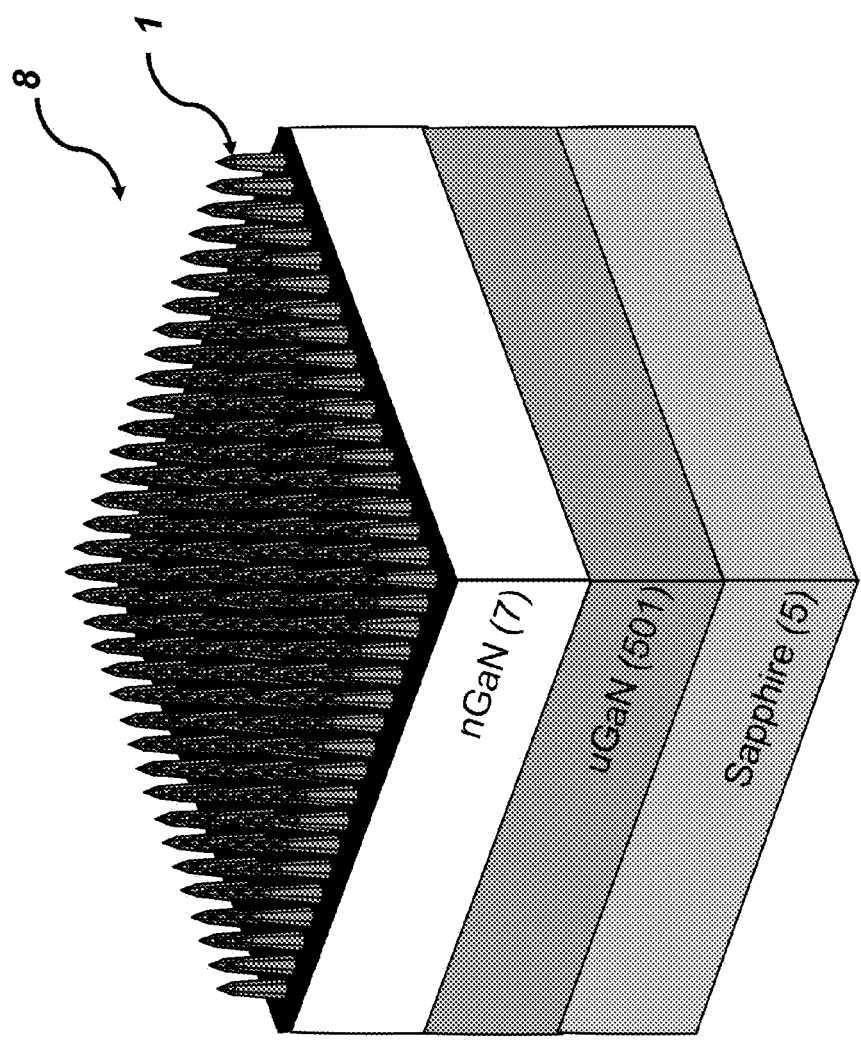
Figure 5B:
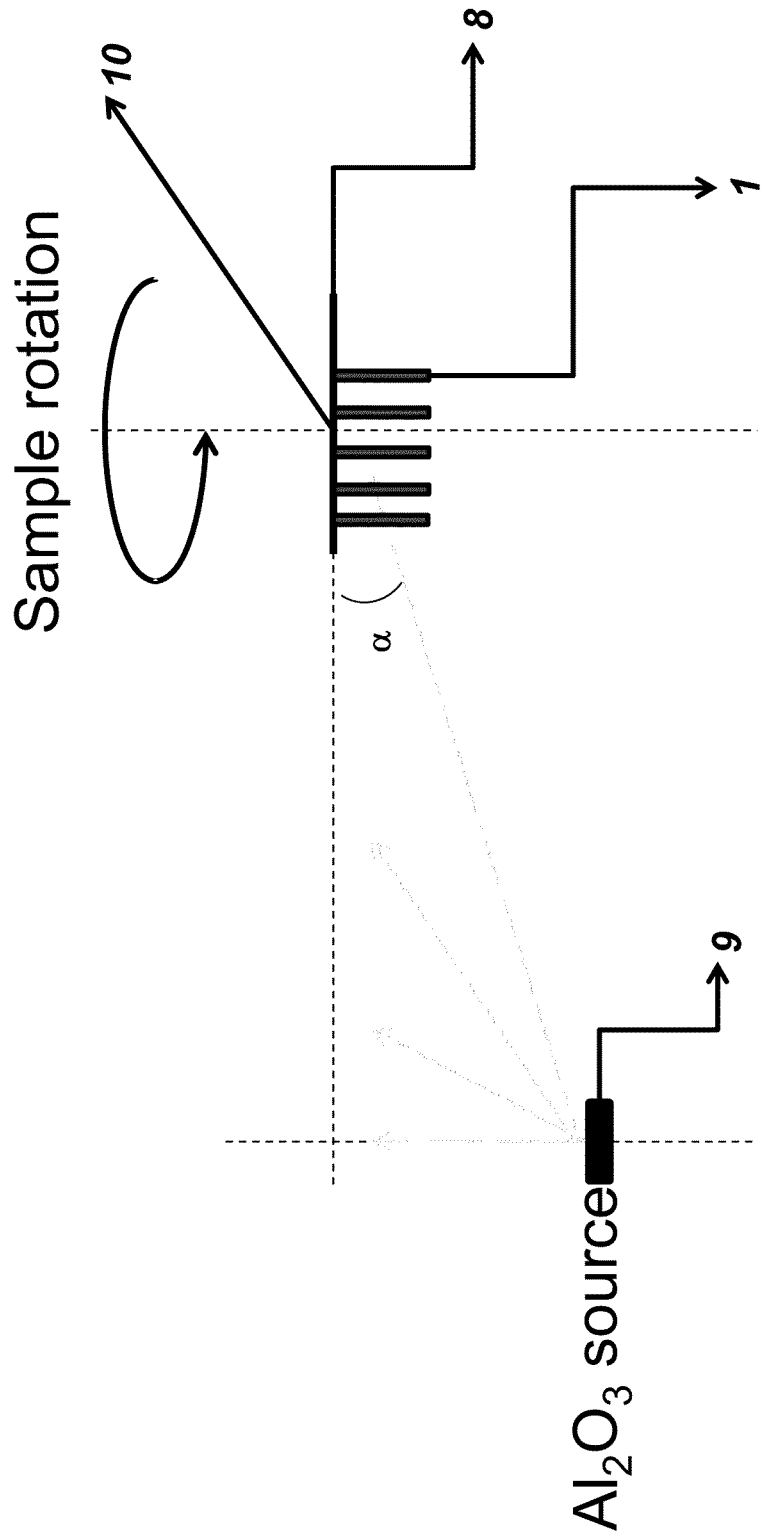

In an exemplary embodiment shown in FIGS. 5A-5C, the following steps are performed on an LED structure such as that shown in FIG. 5A. The LED structure 8 includes a plurality of nanowires 1, such as tapered nanowires that are arranged on a support, where the nanowires comprise a first conductivity type semiconductor core 2 (not shown in FIG. 5A) and a second conductivity type shell 3 that are configured to form a pn or pin junction that in operation provides an active region for light generation (intermediate active layer 4 shown in FIG. 3 and FIG. 4, not shown in FIG. 5A). The solid support includes a bottom substrate layer 5, a buffer layer 7 (e.g., nGaN) that is in electrical contact with the nanowire core 2, and a dielectric masking layer 6 that insulates the nanowire shell 3 from the buffer layer (nanowire core 2, dielectric masking layer 6 and nanowire shell 3 in FIG. 4, not shown in FIG. 5A). Also shown in FIG. 5A is an optional intermediate layer 501 on the support, comprising uGaN, i.e., undoped GaN. This undoped GaN layer reduces the density of crystal defects in the nanowires.

FIG. 5B illustrates a general scheme for angled deposition of an insulating material on the nanowire LED structure; $Al_2O_3$ is shown as the insulator but any suitable insulator, such as dielectric material such as iZnO, $SiO_2$, SiN, $HfO_2$, $TiO_2$, and the like, may be used. The nanowire LED structure is held in place so that the support is in a plane as shown, with nanowires 1 facing perpendicular to the plane.

The nanowire LED structure can be considered to have outer nanowires and inner nanowires, where the outer nanowires are the last row of nanowires in the nanowire LED structure. A source of insulating material 9, e.g., $Al_2O_3$, is positioned such that the source is at an angle α from the plane of the nanowire LED structure, where a is measured as the angle between a line from the center of the source of insulating material to the center of the LED structure and the plane of the nanowire LED structure. If the shape of the LED structure is irregular, the center is considered to be the point at which the axis of rotation intersects the plane of the LED structure (see below). The axis of rotation may or may not coincide with the center of the substrate 8. There also may be multiple axes of rotation. Energy is supplied to the source of the insulating material so as to cause molecules or portions of the material to enter the vapor phase, e.g., by electron beam evaporation or other suitable technique, e.g., sputter deposition. Molecules or other discrete units of the insulating material move out from the source material and those that intersect the nanowire LED structure are deposited on the tips and on the sidewalls of the nanowires 1. The nanowire LED structure is rotated about its center as the deposition occurs on an axis that intersects the LED structure at a point of intersection 10. Sidewalls of outer nanowires may be coated completely, but inner nanowires are shadowed from the deposition and the sidewalls of inner nanowires are partially coated, the portion of the nanowire that is coated being determined by the angle α; generally, the smaller a is, less of the sidewall of inner nanowires will be coated. The nanowire LED structure may include open spaces or isolated nanowires, and in these cases the nanowires on the edge of the open space or the isolated nanowires may have part or all of their sidewalls coated, depending on the size of the open space or degree of isolation and on the angle α.

Further processing, such as laser ablation, laying down of a contact, and the like may be performed, for example as in U.S. Provisional Patent application entitled Nanowire LED structure and method for manufacturing the same, filed on even date herewith, and hereby incorporated by reference herein in its entirety. An exemplary end result is shown in FIG. 5C. In this case, after angled deposition of the insulating layer 503 (e.g., $Al_2O_3$), a transparent conductive oxide (TCO) 505, such as ITO, is deposited over the structure by any suitable method, e.g., sputter deposition, to make electrical contact with the p-GaN sidewalls of the nanowires that have not been coated with the insulating material and provide a p-electrode. Laser ablation is performed to expose the nGaN buffer layer 7 in certain areas and an N-metal contact 507 laid down on the exposed buffer layer 7 to provide an n-electrode. A P-meal contact 905 is formed on the TCO layer 505. The insulating layer 503 on top of the nanowires ($Al_2O_3$ insulator in FIG. 5C) acts to prevent or greatly reduce current leakage through the tips of the nanowires so that current is directed to the exposed areas of the sidewalls.

Figure 9:
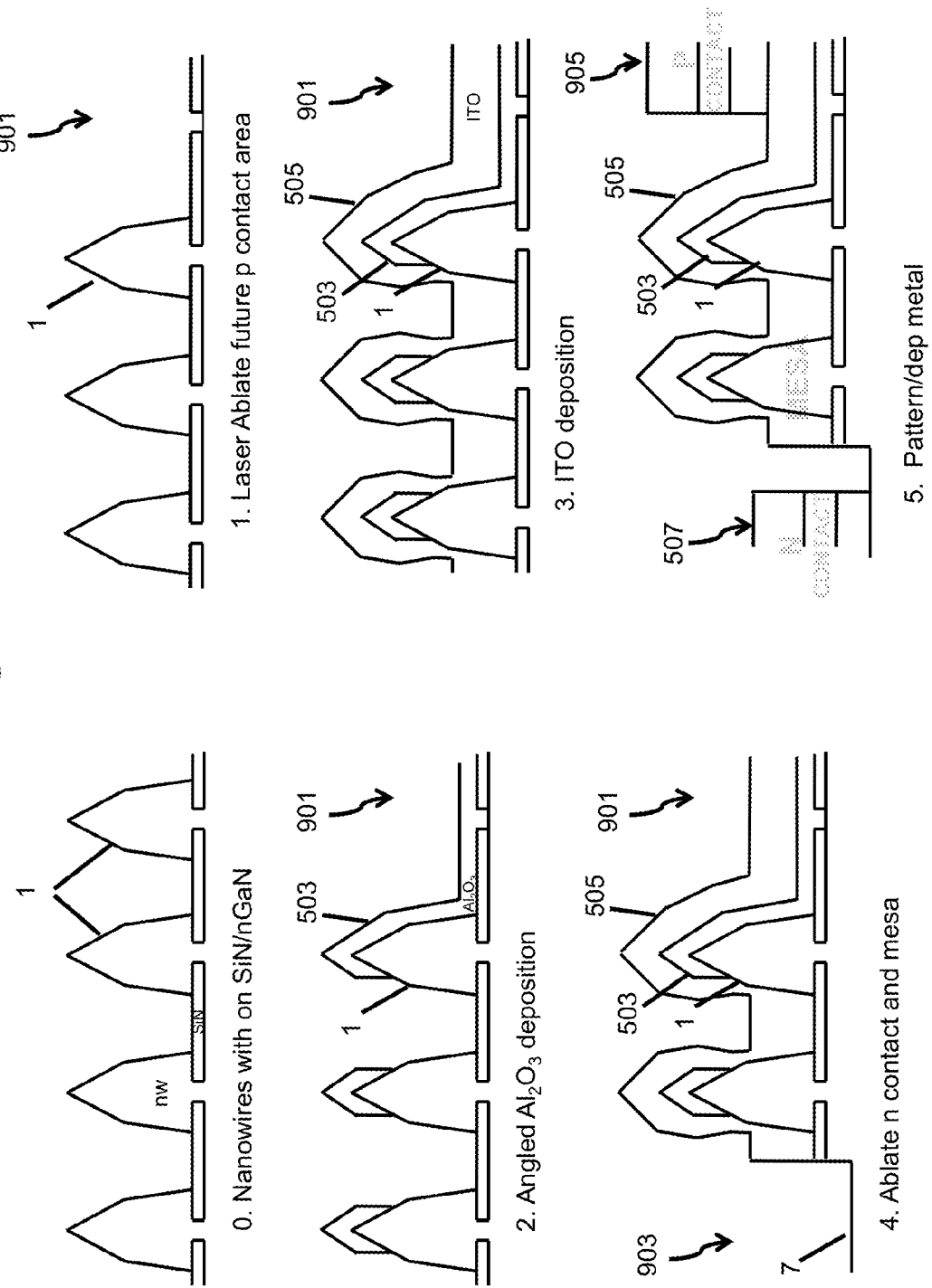
FIG. 9 is a schematic depiction of an embodiment of the methods of the invention.

FIG. 9 is another schematic depiction of an embodiment of the methods of the invention wherein laser ablation is used to create p contact areas and tips of the nanowires are insulated with $Al_2O_3$. A group of nanowires 1 is removed by laser ablation to form a P-side contact area 901 (FIG. 9, step 1), followed by angled deposition of an insulating material 503 (e.g., $Al_2O_3$) over the P-side contact area 901 and tops of nanowires 1, but not between the nanowires 1 (step 2). Then, ITO or another P-side electrode material 505 is formed over the entire device (including between the nanowires in step 3). Then, the N-side contact area 903 is formed by ablating the ITO layer 505, the insulating material 503, the nanowires 1 and the masking layer 6 to expose the n-type buffer layer 7 (step 4). N-side and P-side contacts 507, 905 are then formed by lift off or metal deposition and patterning by photolithography, on respective N-side and P-side contact areas 903, 901.

Figure 11:
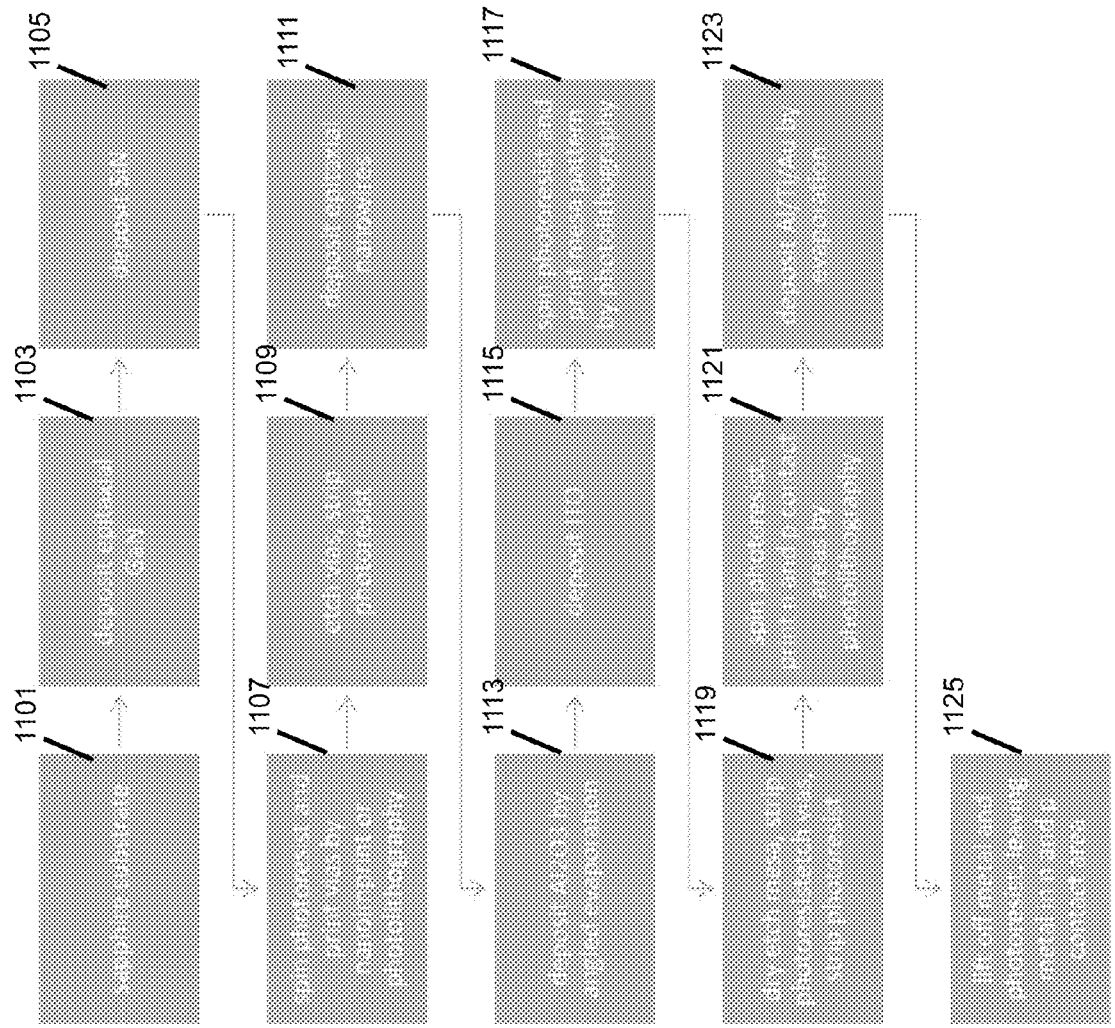
FIG. 11 is a flowchart depiction of an embodiment of the methods of the invention.
Figure 12:
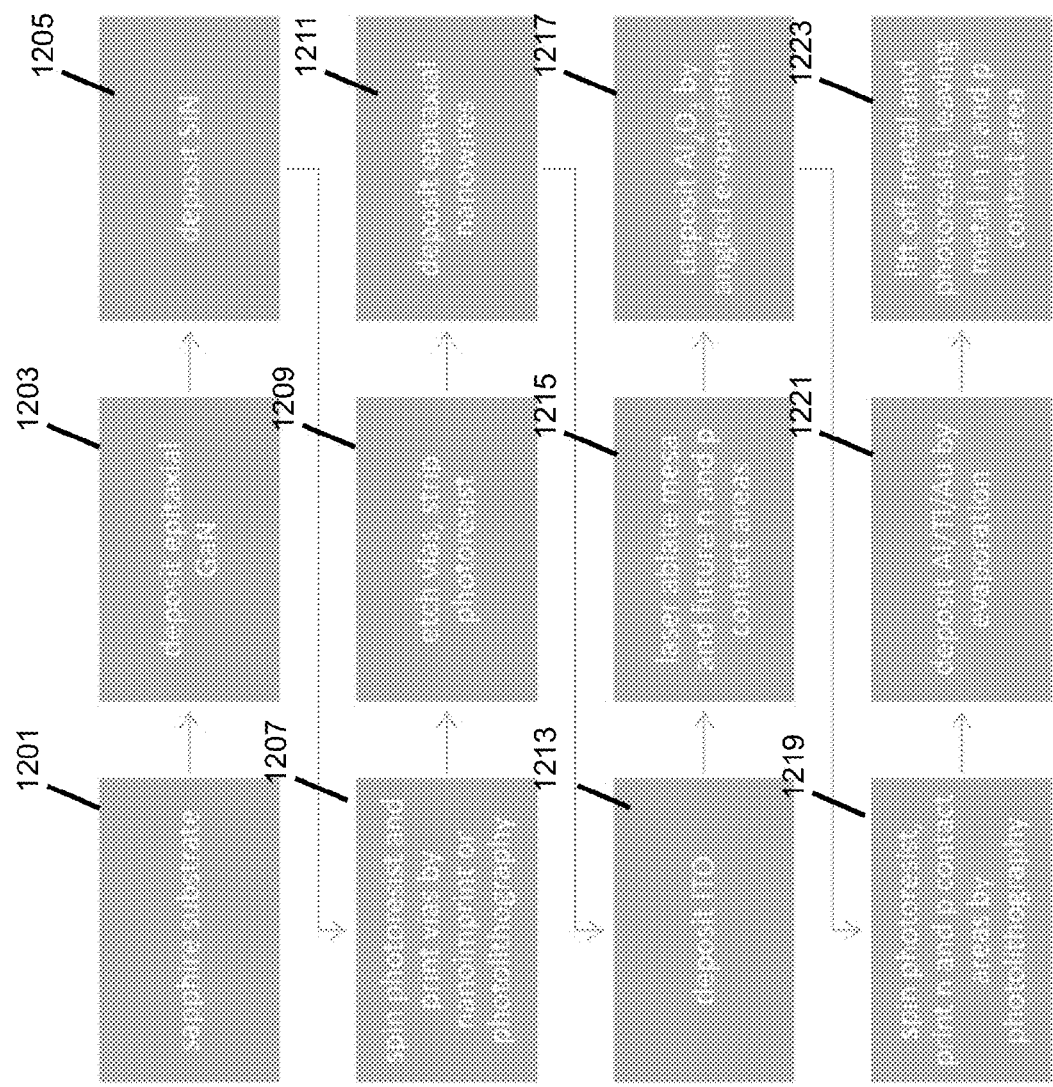
FIG. 12 is a flowchart depiction of an embodiment of the methods of the invention.

FIG. 11 and FIG. 12 are process flow depicts of two embodiments of the methods 1100, 1200 of the invention. Both of the methods 1100, 1200 may include forming a nanowire LED structure as shown in FIGS. 3-5A (e.g., blocks 1101-1111 in FIG. 11, blocks 1201-1211 in FIG. 12), insulating the tips of the nanowires with $Al_2O_3$ (e.g., block 1113 in FIG. 11 and block 1217 in FIG. 12) and depositing ITO (e.g., block 1115 in FIG. 11 and block 1213 in FIG. 12). In FIG. 11, the method 1100 further includes insulating the tips of the nanowires with $Al_2O_3$ (block 1113) and depositing ITO (block 1115). The method 1100 also includes a dry etch process to form the respective N-side and P-side metal contacts, which includes depositing a first photoresist layer and patterning the layer by photolithography to define the N-side contact area and the area of the device (i.e., the "mesa") (block 1117), dry etching to remove the nanowires and expose the n-type buffer layer in the N-side contact area, as well as to isolate the device (i.e., "mesa" etch) (block 1119), depositing a second photoresist layer and patterning the layer by photolithography to define the N- and P-side metal contact areas (block 1121), depositing the material for the metal contacts (e.g., Al/Ti/Au) by evaporation (block 1123), and lifting off the metal and photoresist, leaving the N- and P-side metal contacts in the respective contact areas (block 1125). In FIG. 12, the method 1200 includes depositing the ITO (block 1213), laser ablating the mesa and future n and p contact areas (block 1215), depositing $Al_2O_3$ by angled evaporation (block 1217), depositing a photoresist layer and patterning the layer by photolithography to define the N- and P-side metal contact areas (block 1219), depositing the material for the metal contacts (e.g., Al/Ti/Au) by evaporation (block 1221), and lifting off the metal and photoresist, leaving the N- and P-side metal contacts in the respective contact areas (block 1223). Some steps shown in FIG. 11 and FIG. 12 may be combined.

Figure 6:
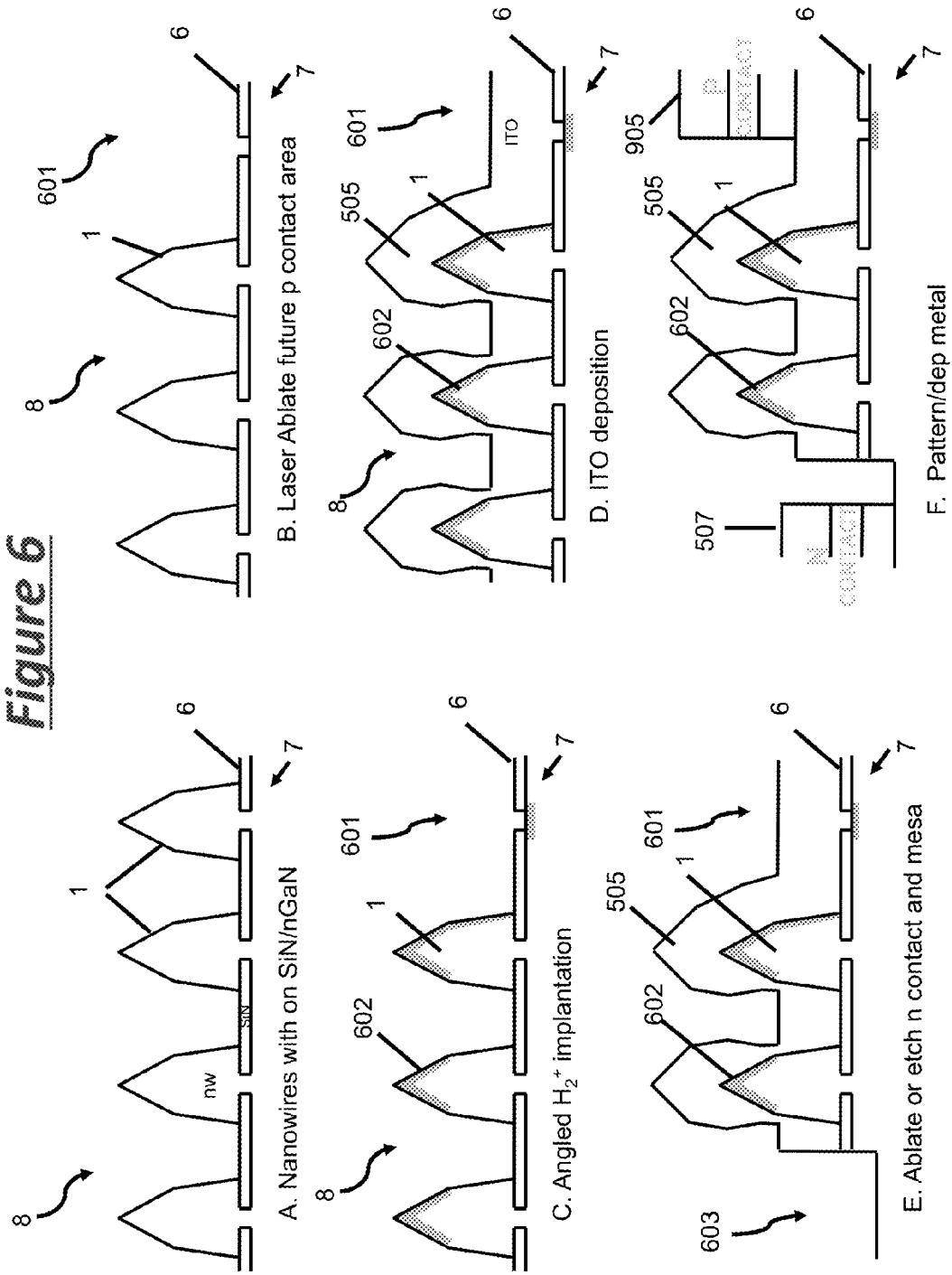
FIGS. 6A-F illustrate a second embodiment of the methods of the invention.

In another exemplary embodiment, shown in FIGS. 6A-F, $^2H^+$ implant is used to modify parts of the nanowires in a nanowire LED structure and laser ablation with further processing is used to provide contacts. As shown in FIG. 6A, the LED structure 8 includes a plurality of nanowires 1, such as tapered nanowires, that are arranged on a support, where the nanowires comprise a first conductivity type semiconductor core 2 (not shown in FIG. 6A) and a second conductivity type shell 3 that are configured to form a pn or pin junction that in operation provides an active region for light generation (intermediate active layer, 4 in FIG. 3 and FIG. 4, not shown FIG. 6A). The solid support includes a bottom substrate layer 5 (not shown in FIGS. 6A-F), a buffer layer 7 that is in electrical contact with the nanowire core 2, and a dielectric masking layer 6 that insulates the nanowire shell 3 from the buffer layer 7. An optional intermediate layer (e.g., uGaN) may be provided on the support 5, as shown in FIG. 5A. This undoped uGaN layer reduces the density of crystal defects in the nanowires. Crystal defects reduce the amount of light produced by the LED.

As shown in FIG. 6B, selective areas of the nanowire LED structure may be exposed by laser ablation. In this embodiment, the nanowires 1 and optionally all or some the masking layer 6 may be removed to expose the n-GaN buffer layer 7. In other embodiments, the nanowires 1 may be removed to expose the masking layer 6 and portions of the n-type buffer layer 7 exposed by the masking layer 6, as shown in FIG. 6B. The laser ablation may define a p-side contact area 601. Laser ablation is described more fully in U.S. Provisional Patent Application 61/719,108, entitled "Nanowire LED Structure and Method for Manufacturing the Same," filed on Oct. 26, 2012, and hereby incorporated by reference herein in its entirety.

Angled $H_2^+$ implantation is then performed, as shown in FIG. 6C. The principle is the same as for the deposition of an insulating material, discussed above, but in the case of hydrogen implantation, $H_2^+$ ions are directed to the wafer. The hydrogen molecules or atoms are implanted to a shallow depth in the substrate, the depth being controlled by the energy of the implant and the angle at which the species impacts the surface. The hydrogen passivates active acceptor and or donor dopants in the semiconductor, thus rendering it less or non-conductive, as known in the art. Both the n-GaN buffer layer that was exposed by laser ablation and the p-GaN tips and parts of the sidewalls of the nanowires are passivated by the $H_2^+$ exposure, rendering them less or non-conductive, schematically indicated as shaded areas 602 in FIG. 6C. As with angled deposition of an insulating material, the portion of the sidewalls of interior nanowires exposed to the hydrogen implant depends on the angle α; outer nanowires sidewalls may be entirely exposed.

FIG. 6D illustrates the deposition of a TCO layer 505, e.g., ITO, to provide an electrical connection to the p-GaN of the exposed sidewalls of the interior nanowires; elsewhere electrical connection to the TCO is blocked by the passivated layer 602, both on the tips of the nanowires and the area of n-GaN buffer layer 7 exposed by laser ablation in the previous step. The n-GaN buffer layer 7 is then re-exposed in a selected n-side contact area 603 by any suitable method, such as laser ablation or, as illustrated in FIG. 6E, dry etching (photolithography and dry etch). The size of the device is defined by the step shown in FIG. 6E while only one device is shown, there may be many hundreds or thousands of devices on a wafer. They are isolated from one another by this etch, called the mesa etch. The TCO layer 505, the nanowires 1, masking layer 6, and any hydrogen-implanted regions 602 are removed from area 603 to expose the conducting n-GaN buffer layer 7.

To form a p-contact 905 and an n-contact 507, photolithography is followed by metal deposition, then lift-off of the photoresist, as shown in FIG. 6F. An exemplary metal deposition stack is Al/Ti/Au with Al in contact with either the n-GaN (n-contact) or TCO, e.g., ITO (p-contact).

It will be appreciated that in the above embodiments, angled deposition of insulating material may be substituted for angled exposure to hydrogen implant, and vice versa.

A nanowire LED is intended to either emit light from the sides of the nanowire, top of the nanowire, e.g., through the p-electrode, or from the bottom of the nanowire, e.g., through the support layer (e.g., through the conductive layer and/or buffer layer and/or substrate) and this has to be taken into account when choosing the contact materials. As used herein, the term light emission includes both visible light (e.g., blue or violet light) as well as UV or IR radiation. For a top emitting nanowire LED, as described in the above example where the light is extracted in the direction from base to the tip of the nanowire, the top contact material should be transparent, e.g., ITO or very thin metal. A reflective layer, such as silver or aluminum, as described below, may make up part of the support. In the case of a bottom emitting nanowire LED, the top contact material can be a reflecting layer like silver or aluminum, as described below. In general the construction of a bottom emitting nanostructure entails providing reflective structure, such as a mirror, at or near i.e. adjacent the top portions of each individual light emitting nanoelement so as to direct the emitted light backwards through the buffer layer of the device. Bottom-emitting electrodes are described further in U.S. Patent Publication No. 2011/0309382, filed on Jun. 17, 2011 and PCT Application No. PCT/US11/40932, filed Jun. 17, 2011, both of which are incorporated herein by reference in their entirety.

Silver, among the metals, has the best reflection coefficient in the visible region of the optical spectra, but is more prone to exhibit corrosion damage in normal atmosphere if not sealed. $Si_3N_4$, $SiO_2$, $Al_2O_3$ or any other stable dielectric can be used as a capping layer. Aluminum has a reflection coefficient in the visible region somewhat lower than silver, but exhibits very good corrosion resistance in dry atmospheric environments. To improve device reliability, an additional dielectric capping layer that covers the reflective layer as described above may still be desired. In the case of a transparent top contact layer, Indium Tin Oxide (ITO), as described, or other transparent compounds like conductive zinc oxide or highly doped semiconductors having high electrical conductivity and transmittance may be used.

Although the present invention is described in terms of altering the properties of selected portions of nanowire LEDs, it should be appreciated that other nanowire based semiconductor devices, such as field-effect transistors, diodes and, in particular, devices involving light absorption or light generation, such as, photodetectors, solar cells, lasers, etc., can be contacted in the same way, and in particular the angled alteration method can be implemented on any nanowire structures.

In one embodiment, plasma is used to damage the tips—the plasma can be of various suitable species, such as Ar or $O_2$. The plasma is directed onto the tips of the wires, while the bottom portion of the wires is covered by a protective layer such as photoresist. Because the nanowire tips are damaged from the plasma, electrical current preferentially passes through the side walls. This preferentially allows the m plane to light up instead of the p-planes on the tip.

In one embodiment, $Ar^+$ is used for treatment to increase the resistivity and contact resistance of p-type GaN. By exposing p-type GaN to energetic $Ar^+$ ions, the sheet resistance of the GaN is increased. The contact resistance of ITO-to-pGaN is also increased on pGaN surfaces treated with $Ar^+$ compared to those that are not. The increase in pGaN sheet resistance and/or contact resistance is sufficient to decrease leakage currents originating in the pGaN. Wafers containing nanowires are placed in a chamber containing argon at a pressure of 100 mTorr, and a plasma is struck with a power of 100 Watts, Ar ions bombard the tips of the nanowires (p planes), as well as the spaces in between the nanowires. The tips of the nanowires, where the pGaN film is thinnest (~5 nm), receive the most damage, and the m plane sidewalls, where the pGaN is much thicker (>100 nm), receive only glancing ions resulting in minimal damage to the m plane sidewall.

Figure 10:
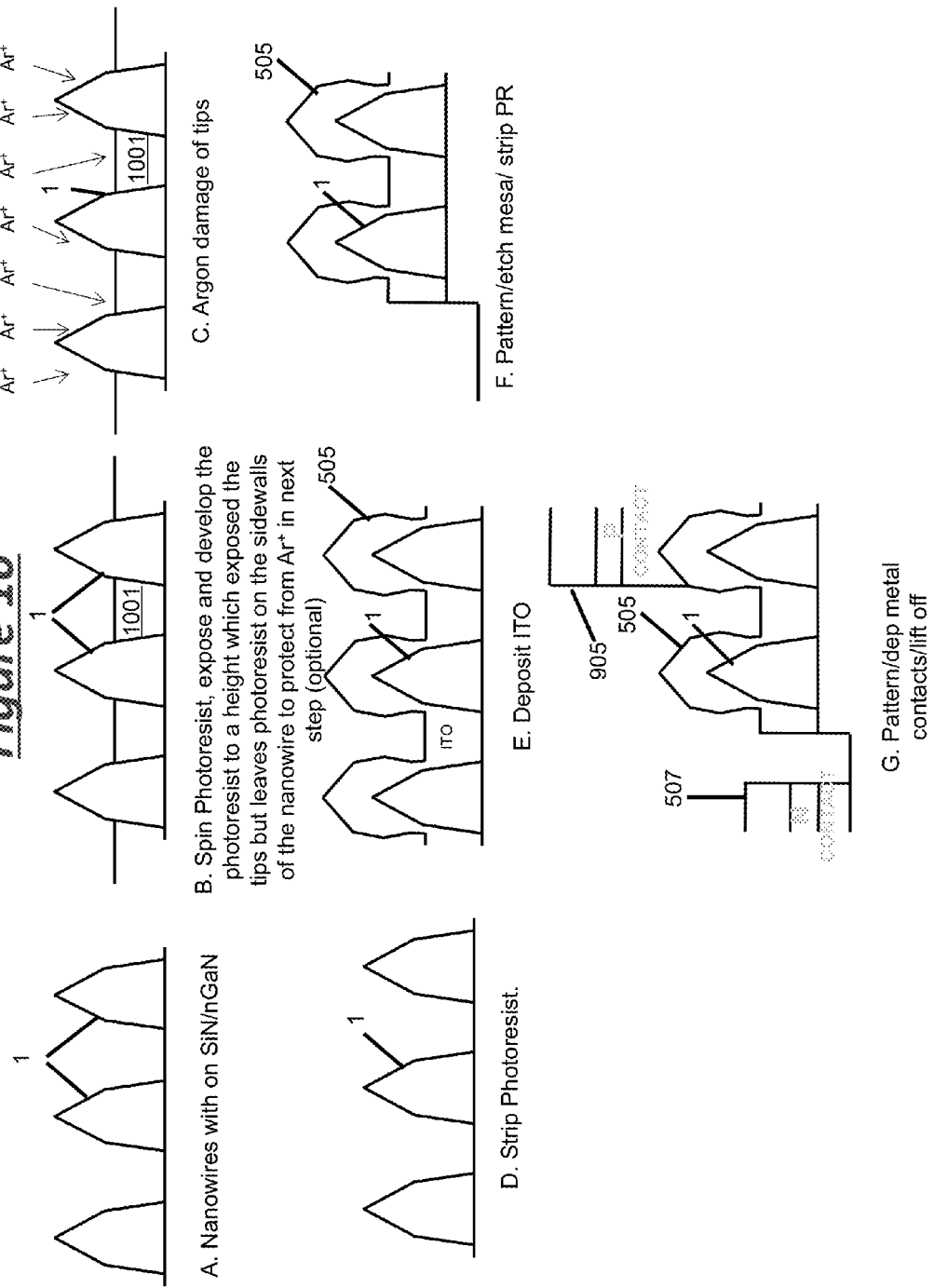
FIGS. 10A-G illustrate one embodiment of the methods of the invention.

FIG. 10 is a schematic of an embodiment of the methods of the invention wherein the nanowire tips are treated with Ar+. FIG. 10A illustrates a plurality of nanowires 1, as described above. A photoresist layer 1001 may optionally be formed over the nanowires 1 (e.g., by spinning, exposing, and developing the photoresist) to a height that exposes the tips of the nanowires 1, but leaves photoresist on the sidewalls of the nanowires to protect from subsequent plasma treatment (e.g., $Ar^+$ treatment), as shown in FIG. 10B. In FIG. 10C, the nanowires 1 are exposed to energetic $Ar^+$ ions which selectively damages the tips of the nanowires 1 and increases the resistance at the tips relative to the sidewalls. The photoresist layer 1001 may then be stripped in FIG. 10D. An ITO layer 505 may be deposited over the nanowires 1, as shown in FIG. 10E, followed by photolithographic patterning and etching (FIG. 10F) and formation of respective P-side and N-side metal contacts 905, 507 (FIG. 10G) as described above.

Figure 13A:
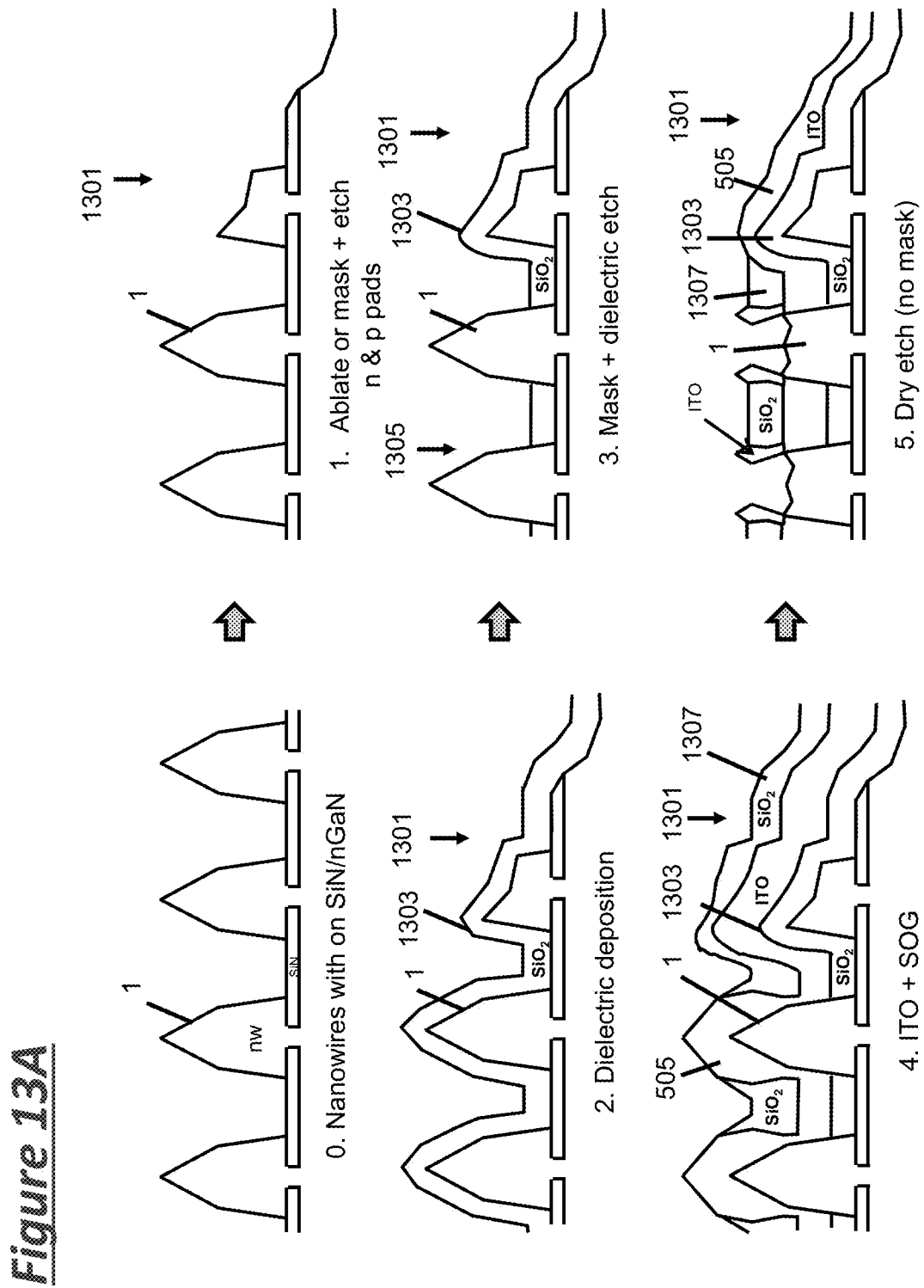
FIGS. 13A and 13B are schematic depictions of steps in an embodiment of the methods of the invention.
Figure 13B:
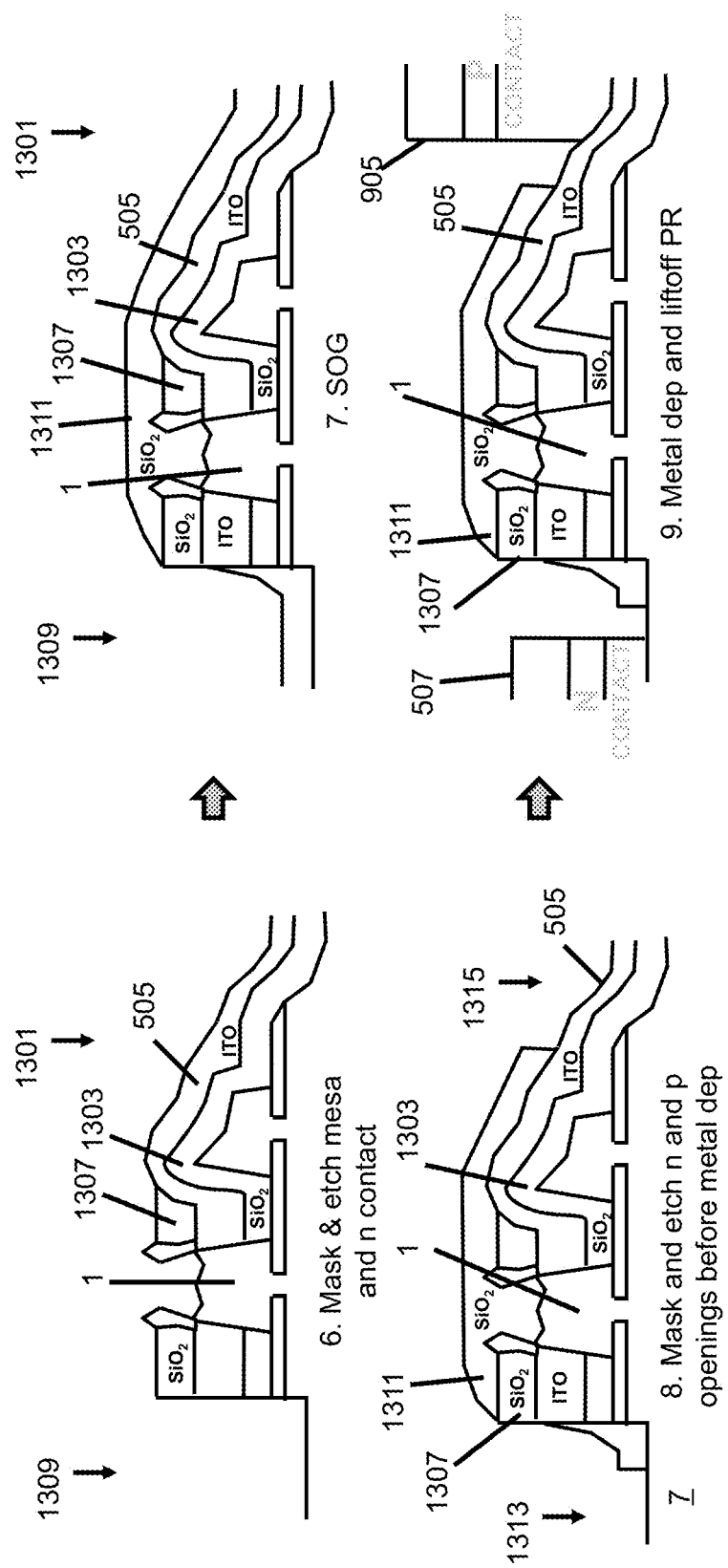
Figure 14:
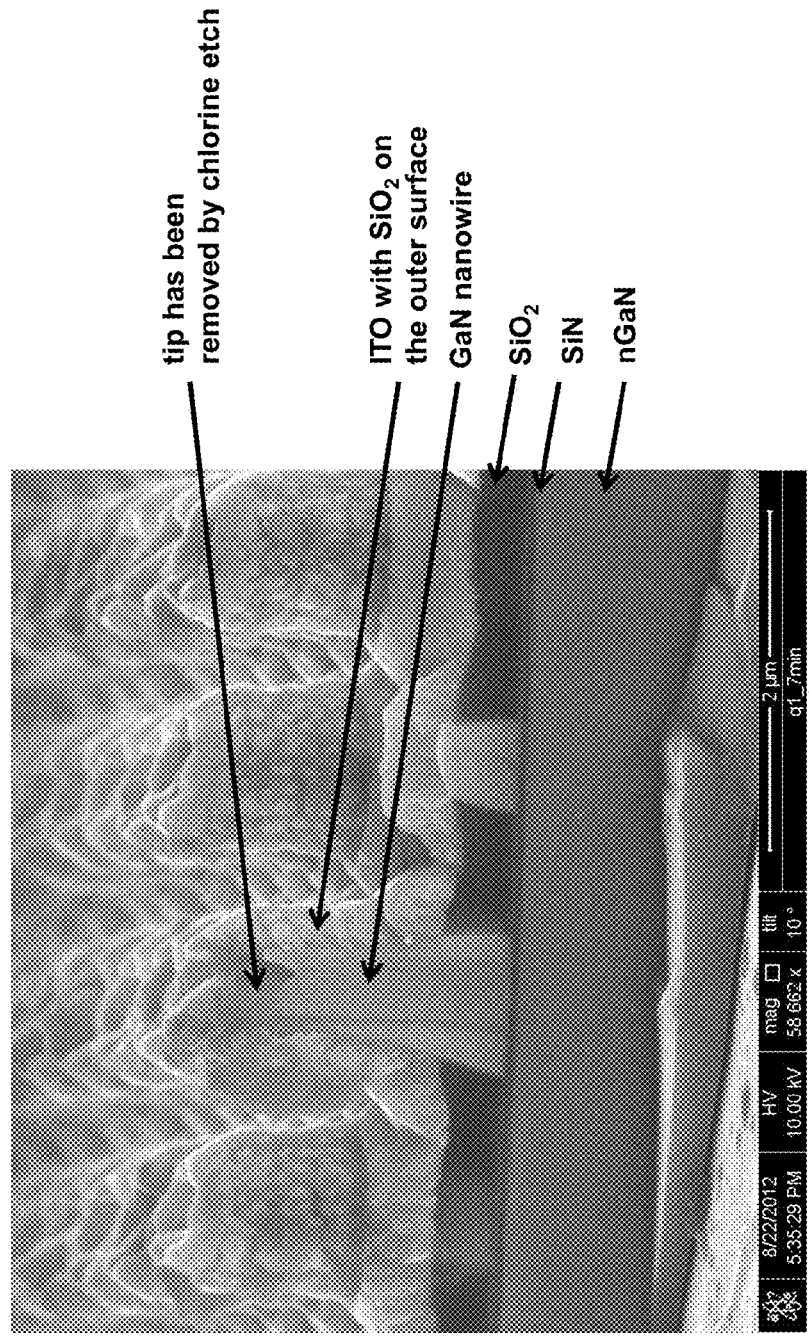
FIG. 14 is a cross sectional SEM image of nanowire after tip removal.

In another aspect of the invention, the tips of the GaN nanowires are removed. In a preferred embodiment, the nanowire tips are selectively removed leaving the m plane sidewalls intact and undisturbed. This technique of removal of the tip can be used in combination with a dielectric barrier (e.g., $Al_2O_3$ film) and/or by increasing the contact resistance and resistivity of the pGaN by etching in argon. An embodiment of a method for the removal of the nanowire tips are described in FIGS. 13A and 13B. FIG. 14 is a SEM of a group of nanowires with the tips etched with chlorine containing etching medium.

One embodiment of a method for removal of the tip is as follows:

1. the nanowires 1 are removed from the future n and p pad areas 1301 by either laser ablation or by mask and etch (step 1). This prevents an n-to-p short forming in future steps, and planarizes the areas for future wire bonding.

2. Next a dielectric 1303 is deposited on the wafer (step 2). The dielectric 1303 can be deposited by spin on methods, chemical vapor deposition, or physical vapor deposition. The preferred method is spin on deposition of glass ($SiO_2$), also known as spin on glass, or SOG. In one preferred embodiment, the nanowires are about 2.5 µm tall, the dielectric is about 1000- about 6000 Å thick, most preferably about 3000 Å as measured on the planar surface at the bottom.

3. Next, a mask of photoresist (not illustrated) is applied to the pad areas, and the dielectric 1303 is removed in unmasked areas 1305 by wet or dry etch (step 3). Wet etch by dilute hydroflouric acid (HF) is preferred to avoid plasma damage. It is preferred to leave some dielectric 1303 (e.g., $SiO_2$) at the base of the nanowires 1 while removing the $SiO_2$ from the nanowire tips and sidewalls. When the SiO$_2$ is deposited by spin on methods, the film is thin on the sidewalls and thicker at the bottom. This enables short HF etch to remove the film from the sidewalls while leaving the thicker film at the bottom. Other dielectric films may be used, such boron-doped SiO$_2$ (BSG), phosphorus doped SiO$_2$ (PSG), boron and phosphorus doped SiO$_2$ (BPSG), low k dielectrics like Si—C—O—H, high k films like Al$_2$O$_3$ of HfO$_2$, and other suitable dielectrics.

4. A transparent conductive oxide (TCO) film 505 such as indium tin oxide (ITO) is deposited next (step 4). Other TCO films such as aluminum doped zinc oxide can also be used. The film can be deposited by physical methods such as evaporation or sputtering, by CVD, or by a combination of methods. It is most preferably deposited by a sputtering method that preferably does not damage the pGaN. The ITO film can be about 100 Å to about 10,000 Å thick, most preferably about 8,000 Å. A dielectric film 1307 like SiO$_2$ is then deposited on top of the ITO 505. The dielectric 1307 can be deposited by spin on methods, evaporation or sputtering, or by CVD. It is most preferably deposited by spin on methods, resulting in a thin film on the tip, and thicker film at the base of the wires where it is planar.

5. In the next step (step 5), the wafer is dry etched in chlorine gas plasma without a mask on the wafer. Chlorine will etch SiO$_2$, ITO, and GaN. The GaN has the fastest etch rate of the three films, resulting in the profile shown in the process flow chart on step 5 in FIG. 13A, and the SEM image on FIG. 14. Due to the anisotropic nature of the etch, the tips are etched faster than the sidewalls. The SiO$_2$ 1307 deposited in step 4 in FIG. 13 protects the ITO 505 on the sidewalls from etch. The slower etch rate and thicker films at the base of the nanowires ensures those films remain after the GaN nanowire tip has been removed by etching.

6. In the next step (step 6, FIG. 13B), standard lithography is used to mask the mesa pattern with photoresist, and films are removed in the future n contact area 1309 and around the mesa edge to define and isolate the device.

7. Then a dielectric 1311 (e.g., SOG) is deposited to passivate the sidewalls of the device and any exposed partially etched nanowires 1 (step 7).

8. Finally, standard photolithography is used to deposit a mask (e.g., resist) that covers all features except for the n and p contact areas 1313, 1315. These exposed n and p contact areas 1313, 1315 are wet or dry etched to remove dielectric 1311 from them, exposing the nGaN buffer layer 7 and ITO 505, respectively (step 8). A metal contact stack consisting of Al, Ti, and Au is then deposited by evaporation. The photoresist mask with metal is then lifted off the wafer, leaving the P-metal and N-metal contacts 905, 507 (step 9).

This method described above for removing the tips of nanowires may be suitably modified by a person of skill in the art and it is apparent that a person of skill in the art may perform the steps in any suitable order, and not specifically the order described above.

The invention also provides LED structures.

In certain embodiments, the invention provides an LED structure comprising a support comprising a n-GaN buffer layer and an non-conducting substrate layer and an array of nanowires on the support, wherein the nanowires comprise a n-GaN core enclosed by a p-GaN shell, where in the structure comprises (i) a n-electrode region comprising a metal contact in electrical contact with the n-GaN buffer layer; and (ii) a p-electrode region comprising (a) a non-conductive layer that comprises the tips of the nanowires and a first portion of the sidewalls of a first group of the nanowires, but not a second portion of the sidewalls of the first group of nanowires, and optionally all of the sidewalls of a second group of the nanowires, wherein the first group of nanowires are in the interior of the nanowire array and the second group of nanowires are on the exterior edge of the nanowire array; (b) a conductive layer in electrical contact with the second portion of the sidewalls of the first group of nanowires: and (c) a metal contact in electrical contact with the conductive layer.

In certain of these embodiments, the non-conductive layer comprises an insulating material layer on top of the tips and the portions of the sidewalls, such as a layer comprising Al$_2$O$_3$. In other embodiments, the non-conductive layer comprises a modified portion of the p-GaN shell that has been modified to reduce or eliminate its conductivity. This may be, e.g., a portion that has been modified by exposure to $^2$H$^+$, as described herein, so as to be less conductive.

In certain embodiments, the first portion of the sidewalls of the first group of nanowires extends less than 400 nm down the sidewall of the nanowires from the tip, such as less than 300 nm, for example 200 nm or less. In certain embodiments, the first portion of the first group of nanowires extends less than 50% of the length of the sidewall, e.g., less than 40%, such as less than 30% or even less than 20%.

In certain embodiments, the metal contacts comprise a layer of Al, a layer of Ti, and a layer of Au, such as where the Al layer is in direct contact with the n-GaN buffer layer in the n-electrode and the conductive layer in the p-electrode.

Though the embodiments have been described in terms of altering the properties of the selected parts of the LED nanowires to render them less conductive, it will be appreciated that similar techniques may be used to render certain parts of LED nanowires more conductive, e.g., conductive materials may be deposited to selectively contact the tips of nanowires.

In particular, it should be emphasized that although the figures illustrate embodiments having a pillar-like geometry and are based on nano wire core, i.e. "one dimensional" cores, it should be understood that the cores can have other geometries such as pyramidal shapes by changing growth conditions. Also, by changing growth conditions, the final nano element can have a pyramidal shape, or any shape between a pillar-like and a pyramid shape.

EXAMPLES

Example 1

Formation of a Dielectric Insulating Layer by Angled Deposition

Figure 7A:
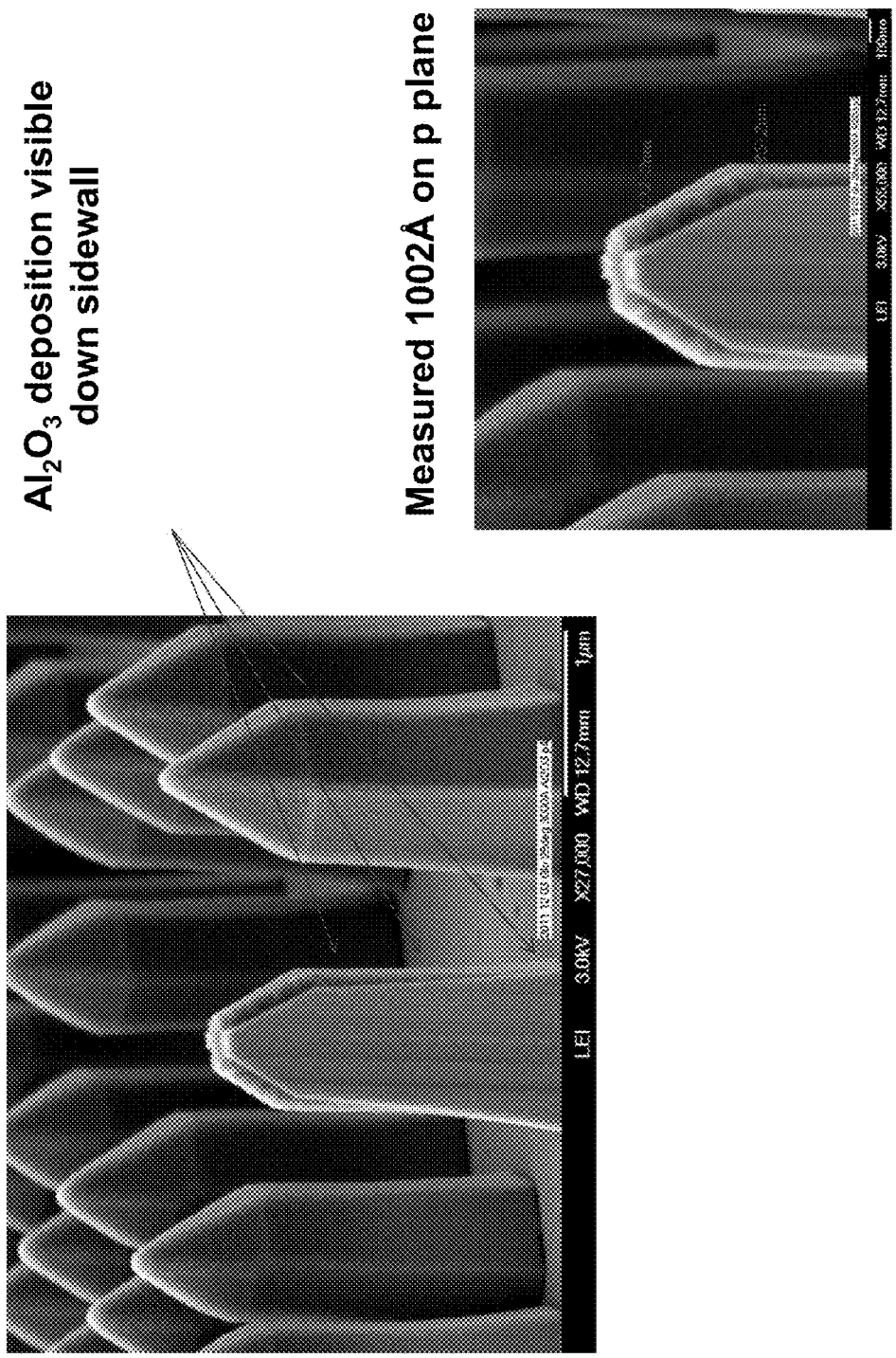
FIGS. 7A and B illustrate deposition of an insulating material in isolated and dense nanowires.

A nanowire LED structure was selectively coated with Al$_2$O$_3$ to provide an insulating layer. Electron beam evaporation physical vapor deposition was used and the angle α was set to 28°. Deposition was controlled to achieve a thickness of ~100 nm on sidewalls of the nanowire. As shown in FIG. 7A, a semi-isolated nanowire, i.e., nanowire with no nearest neighbors, exhibited Al$_2$O$_3$ deposition down the sidewall; the deposition on the p-plane was measured at 102.3 nm. FIG. 7B shows deposition on a dense feature, i.e., an interior nanowire surrounded by other nanowires. In this case, Al$_2$O$_3$ is deposited on the tips of the nanowires, and no Al$_2$O$_3$ deposition is visible on the lower half of the sidewall of the nanowire.

This example illustrates that angled deposition of an insulating material can selectively coat the tips but not part of the sidewall of interior nanowires.

Example 2

Influence of the Acuity of the Angle of Deposition on Sidewall Coating

Figure 8:
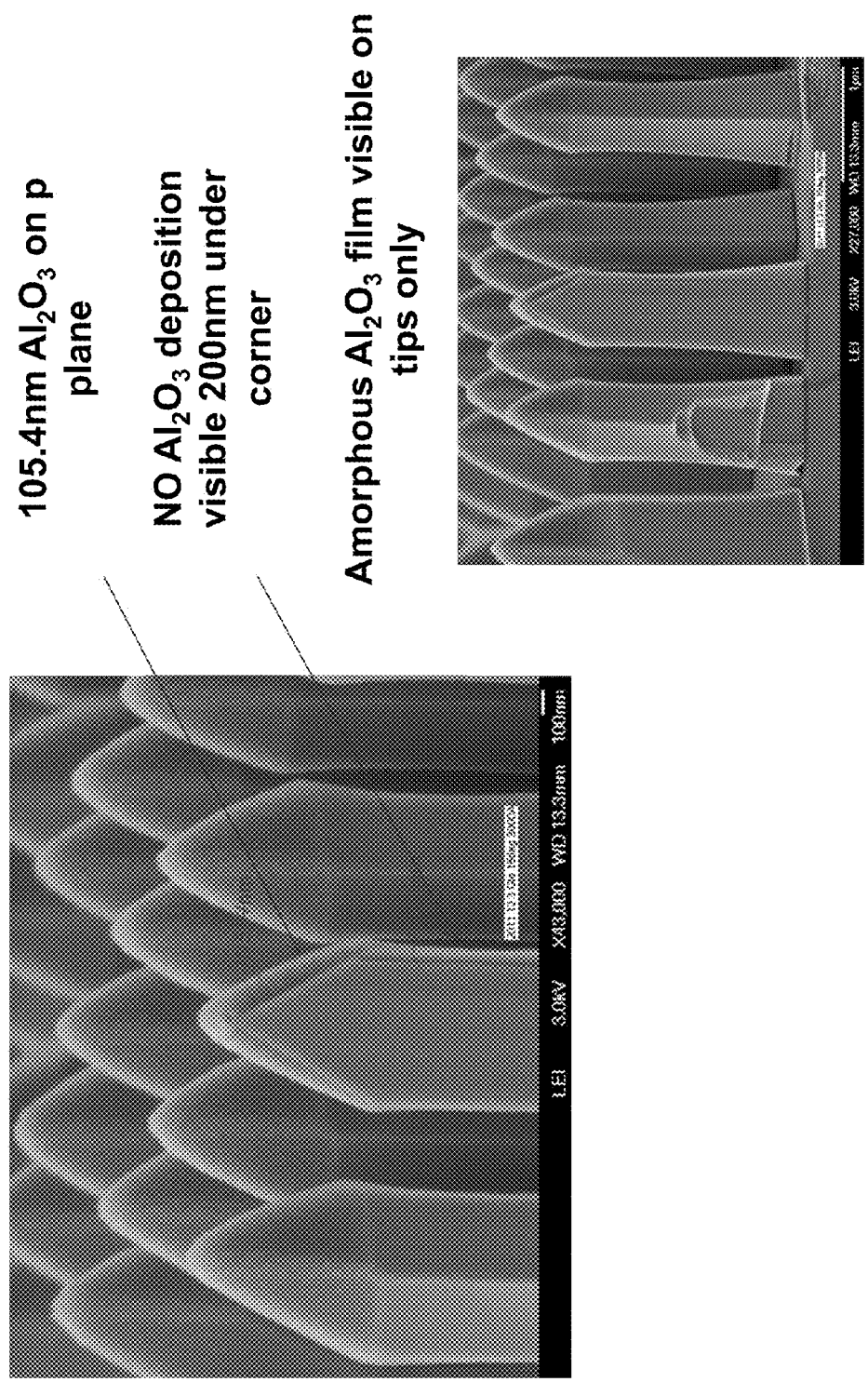
FIG. 8 shows a dense nanowire feature with an angle of deposition of 15°.

Similar conditions to Example 1 were used except the angle α was set to 15°. As shown in FIG. 8, in a dense feature (interior nanowire) the $Al_2O_3$ coating did not extend below 200 nm under the corner of the tip, which is well above halfway up the nanowire sidewall.

This example illustrates that controlling the angle of deposition can control the portion of the sidewall of interior nanowires that is exposed to the insulating material, allowing deposition on the tip and a selected portion of the sidewalls, but leaving most of the sidewall free of insulating material.

Example 3

$^2H^+$ Implant on pGaN and Effect on Conductivity

A planar wafer comprising the p-type GaN film on top of a sapphire substrate was constructed with ITO contacts at two different points and a voltage was applied across the contacts, and current measured. Similar wafers were constructed where the pGaN was implanted with $H_2^+$ before ITO contact, in one case implant conditions were 30 keV $^2H^+$ to a dose of 2.5e14/cm2, and in another case implant conditions were 120 keV $^2H^+$ to a dose of 5e14/cm2. In the $^2H^+$ implanted wafers the conductivity of the pGaN was reduced by over 6 orders of magnitude compared to the non-implanted control wafer.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

What is claimed is:

1. A method for treating a LED structure with a substance, the LED structure comprising an array of nanowires on a planar support, comprising producing the substance at a source and causing it to move to the array along a line, wherein
   (i) the angle between the line followed by the substance and the plane of the support is less than 90° when measured from the center of the support; and
   (ii) the substance is capable of rendering a portion of the nanowires nonconductive or less conductive compared to before being treated by the substance; and
   wherein the nanowires comprise a tip and a sidewall, and the array comprises edge nanowires and central nanowires, and wherein the angle is such that central nanowires are rendered nonconductive at the tip and along a portion but not all of their sidewall.

2. The method of claim 1 wherein at least one of:
   (a) the substance is an insulator and renders the portion of the nanowires nonconductive or less conductive by coating the portion; and
   (b) the substance reacts with the portion of the nanowire to render the portion nonconductive or less conductive.

3. The method of claim 2 wherein the substance comprises any of $SiO_2$, SiCOH, $Al_2O_3$, SiN, $TiO_2$, $HfO_2$, or combinations or alloys thereof.

4. The method of claim 1 wherein at least one of:
   (a) the angle is less than 45°; and
   (b) the substance is produced and caused to move to the nanowires by physical vapor deposition (PVD).

5. The method of claim 4 wherein at least one of:
   (a) the angle is less than 30°;
   (b) the substance is produced and caused to move to the nanowires by PVD and the PVD comprises electron beam deposition; and
   (c) the substance is produced and caused to move to the nanowires by PVD and the PVD comprises sputter deposition.

6. The method of claim 1 wherein the method comprises deposition of a dielectric material and wherein the depth of the dielectric material on the tip of the nanowires is between 50 and 200 nm.

7. The method of claim 1 wherein the nanowires comprise a first conductivity type nanowire core and a second conductivity type nanowire shell, and wherein the first conductivity type semiconductor nanowire core is enclosed by the second conductivity type semiconductor shell for forming a pn or pin junction that in operation provides an active region for light generation.

8. The method of claim 7 wherein at least one of:
   (a) the first conductivity type comprises n-type, and the second conductivity type comprises p-type;
   (b) the support comprises a n-type buffer layer from which the nanowire core is grown during production of the array of nanowires; and
   (c) the support comprises a buffer layer and a dielectric masking layer, such that cores protrude from the buffer layer through openings in the masking layer, and the shells are located on the masking layer.

9. The method of claim 8 wherein the support comprises the buffer layer and at least one of:
   (a) the buffer layer comprises at least one of gallium nitride or aluminum gallium nitride;
   (b) the support further comprises a substrate layer beneath the buffer layer; and
   (c) the support further comprises a reflective layer.

10. The method of claim 9 wherein:
    (a) the support further comprises the substrate layer beneath the buffer layer and the substrate layer comprises at least one of $Al_2O_3$, ZnO and Si; and
    (b) the support further comprises the reflective layer, and the reflective layer comprises Ag.

11. The method of claim 8 wherein the support comprises the buffer layer, and the method further comprising exposing the buffer layer in a first region of the LED structure.

* * * * *